(12) United States Patent
Wang

(10) Patent No.: US 11,489,274 B2
(45) Date of Patent: Nov. 1, 2022

(54) QUICK RELEASE CONNECTING DEVICE

(71) Applicant: Ting-Jui Wang, New Taipei (TW)

(72) Inventor: Ting-Jui Wang, New Taipei (TW)

(*) Notice: Subject to any disclaimer, the term of this patent is extended or adjusted under 35 U.S.C. 154(b) by 73 days.

(21) Appl. No.: 17/113,363

(22) Filed: Dec. 7, 2020

(65) Prior Publication Data

US 2021/0091489 A1 Mar. 25, 2021

Related U.S. Application Data

(63) Continuation-in-part of application No. 16/681,972, filed on Nov. 13, 2019, now Pat. No. 11,047,407, which is a continuation-in-part of application No. 16/224,841, filed on Dec. 19, 2018, now Pat. No. 10,686,288.

(30) Foreign Application Priority Data

Dec. 22, 2017 (CN) .......................... 201711400169.6

(51) Int. Cl.
*H05K 7/14* (2006.01)
*H01R 12/70* (2011.01)

(52) U.S. Cl.
CPC ..... *H01R 12/7058* (2013.01); *H01R 12/7023* (2013.01)

(58) Field of Classification Search
CPC ......... F16B 2/04; F16B 2/185; H05K 7/1409; H01R 12/7058
See application file for complete search history.

(56) References Cited

U.S. PATENT DOCUMENTS

| | | | | |
|---|---|---|---|---|
| 2,514,246 | A * | 7/1950 | Knox | H05K 7/1421 174/541 |
| 2,609,268 | A * | 9/1952 | Nye | H01M 50/20 292/210 |
| 4,002,381 | A * | 1/1977 | Wagner | H05K 7/1439 361/801 |
| 4,301,494 | A | 11/1981 | Jordan | |
| 4,313,150 | A * | 1/1982 | Chu | H05K 7/1409 439/153 |

(Continued)

OTHER PUBLICATIONS

Non-Final Office Action dated Jul. 29, 2019 for U.S. Appl. No. 16/224,841.

(Continued)

*Primary Examiner* — Neil Abrams
(74) *Attorney, Agent, or Firm* — Schmeiser, Olsen & Watts, LLP

(57) ABSTRACT

A quick release connecting device includes an actuating retainer and a fixing member movably assembled to the actuating retainer. The fixing member includes a pivot portion and a pivot member movably mounted to the pivot portion; and the pivot member is coupled with a second object. The fixing member includes a limiting section and the pivot member includes a corresponding limiting section, such that the limiting section and the corresponding limiting section limit or stop each other at a specific location when the fixing member is moved or rotated. With these arrangements, the quick release connecting device can be applied to conveniently and repeatedly connect and separate a circuit board, a drawer, or a window to and from a corresponding rack, chassis, cabinet or window frame.

8 Claims, 27 Drawing Sheets

(56) References Cited

U.S. PATENT DOCUMENTS

| | | | |
|---|---|---|---|
| 4,403,102 A | 9/1983 | Jordan | |
| 4,445,740 A * | 5/1984 | Wallace | H01R 13/629 |
| | | | 439/157 |
| 4,614,389 A | 9/1986 | Albert | |
| 4,914,552 A * | 4/1990 | Keemer | H05K 7/1404 |
| | | | 361/801 |
| 4,931,907 A * | 6/1990 | Robinson | H05K 7/1411 |
| | | | 361/732 |
| 4,975,073 A * | 12/1990 | Weisman | H05K 7/1409 |
| | | | 439/153 |
| 5,010,426 A * | 4/1991 | Krenz | H05K 7/1411 |
| | | | 360/99.06 |
| 5,139,430 A | 8/1992 | Lewis | |
| 5,191,970 A * | 3/1993 | Brockway | H05K 7/1414 |
| | | | 340/687 |
| 5,293,303 A * | 3/1994 | Fletcher | H05K 7/1409 |
| | | | 439/157 |
| 5,340,340 A * | 8/1994 | Hastings | H05K 7/1489 |
| 5,414,594 A | 5/1995 | Hristake | |
| 5,587,888 A * | 12/1996 | Joist | H05K 7/1409 |
| | | | 361/802 |
| 5,791,753 A * | 8/1998 | Paquin | G06F 1/181 |
| | | | 312/223.1 |
| 6,160,717 A * | 12/2000 | Desousa | H05K 7/1409 |
| | | | 361/801 |
| 6,222,736 B1 * | 4/2001 | Sim | G06F 1/188 |
| | | | 361/732 |
| 6,267,614 B1 * | 7/2001 | Good | H01R 13/639 |
| | | | 439/160 |
| 6,361,335 B1 * | 3/2002 | Calanni | H05K 7/1409 |
| | | | 439/157 |
| 6,381,146 B1 * | 4/2002 | Sevier | H05K 7/1411 |
| | | | 361/740 |
| 6,494,729 B1 * | 12/2002 | Stathopoulos | H01R 13/701 |
| | | | 439/372 |
| 6,579,029 B1 * | 6/2003 | Sevde | H05K 7/1414 |
| | | | 403/321 |
| 6,582,241 B1 | 6/2003 | Lutz, Jr. | |
| 6,648,667 B2 | 11/2003 | Heidenreich | |
| 6,878,006 B1 | 4/2005 | Heidenreich | |
| 6,884,096 B2 * | 4/2005 | Centola | H01R 12/7076 |
| | | | 439/157 |
| 6,916,190 B2 | 7/2005 | Joist | |
| 7,159,283 B2 * | 1/2007 | Chang | H05K 7/1409 |
| | | | 24/457 |
| 7,168,772 B1 * | 1/2007 | Liang | G06F 1/183 |
| | | | 361/747 |
| 7,182,623 B1 | 2/2007 | Lewis | |
| 7,203,067 B2 * | 4/2007 | Beall | H05K 7/1409 |
| | | | 361/801 |
| 7,284,997 B2 * | 10/2007 | Joist | H05K 7/1409 |
| | | | 439/157 |
| 7,295,447 B2 * | 11/2007 | Strmiska | H05K 7/1409 |
| | | | 361/801 |
| 7,297,008 B2 | 11/2007 | Griffin | |
| 7,301,778 B1 | 11/2007 | Fang | |
| 7,344,394 B1 * | 3/2008 | Barina | G06F 1/183 |
| | | | 361/755 |
| 7,354,293 B2 * | 4/2008 | Liang | H05K 7/1411 |
| | | | 439/372 |
| 7,414,860 B1 * | 8/2008 | Chen | G06F 1/188 |
| | | | 361/801 |
| 7,532,486 B2 * | 5/2009 | Strmiska | H05K 7/1409 |
| | | | 361/801 |
| 7,749,006 B2 * | 7/2010 | Chiang | H05K 7/1409 |
| | | | 439/160 |
| 8,037,578 B2 * | 10/2011 | Megason | F16C 11/04 |
| | | | 16/273 |
| 8,045,326 B1 * | 10/2011 | Reznikov | G06F 1/187 |
| | | | 361/679.33 |
| 8,118,271 B2 * | 2/2012 | Peng | G06F 1/187 |
| | | | 248/221.11 |
| 8,295,055 B2 * | 10/2012 | Van Der Mee | H05K 7/1407 |
| | | | 361/759 |
| 8,585,161 B2 * | 11/2013 | Gong | H05K 5/023 |
| | | | 312/223.2 |
| 8,638,563 B2 * | 1/2014 | Peng | H05K 7/1401 |
| | | | 361/740 |
| 8,811,026 B2 | 8/2014 | Engelvin | |
| 9,093,830 B2 | 7/2015 | Krieg | |
| 9,617,766 B2 * | 4/2017 | Eckberg | E05C 3/14 |
| 9,736,961 B2 * | 8/2017 | Conn | G06F 1/181 |
| 10,064,299 B2 | 8/2018 | Chen | |
| 10,070,549 B2 * | 9/2018 | Su | H05K 7/1409 |
| 10,117,350 B2 | 10/2018 | Kuang | |
| 10,396,497 B1 | 8/2019 | Bame | |
| 10,462,922 B2 * | 10/2019 | Moreau | H05K 7/1439 |
| 10,686,268 B2 | 6/2020 | Wang | |
| 10,945,348 B2 * | 3/2021 | Wang | H05K 7/1409 |
| 11,047,407 B2 * | 6/2021 | Wang | H05K 7/1409 |
| 11,225,988 B2 * | 1/2022 | Wang | F16B 5/0016 |
| 2004/0025295 A1 | 2/2004 | Becker | |
| 2005/0111178 A1 * | 5/2005 | Bradley | H05K 7/1411 |
| | | | 360/99.06 |

OTHER PUBLICATIONS

Final Office Action dated Nov. 19, 2019 for U.S. Appl. No. 16/224,841.

Notice of Allowance dated Mar. 25, 2020 for U.S. Appl. No. 16/224,841.

Non-Final Office Action dated Sep. 30, 2020 for U.S. Appl. No. 16/681,972.

\* cited by examiner

QUICK RELEASE CONNECTING DEVICE

CROSS-REFERENCE TO RELATED APPLICATION

This application is a continuation-in-part patent application of U.S. application Ser. No. 16/681,972 filed on Nov. 13, 2019, which is a CIP of U.S. application Ser. No. 16/224,841 filed on Dec. 19, 2018, now U.S. Pat. No. 10,686,268 issued Jun. 16, 2020, which claims priority to Application No. 201711400169.6 filed in China on Dec. 22, 2017, the entire contents all of which are hereby incorporated by reference for which priority is claimed under 35 U.S.C. § 120.

BACKGROUND OF THE INVENTION

1. Field of the Invention

The present disclosure relates to a quick release connecting device, and in particular to a quick release connecting device that enables convenient and repeated assembling and separation of a circuit board, a drawer, or a window to and from a corresponding rack, chassis, cabinet or window frame.

2. DESCRIPTION OF THE RELATED ART

To enable convenient assembling and fastening of a circuit board to a rack, and to enable easy disassembling of the circuit board from the rack when necessary, a quick release mechanism is usually provided on the circuit board or the rack. Various types of quick release mechanisms are known, and each type of circuit board has a corresponding quick release mechanism designed for it. To enable two mating objects, such as the circuit board and the rack, to be repeatedly assembled to and separated from each other in a quick and convenient manner, it is desirable to develop an improved quick release connecting device that includes means to assist in pushing away a first one of the two mating objects, so that the second object can be easily pulled out of the first object.

BRIEF SUMMARY OF THE INVENTION

In view that the prior art quick release mechanisms are not perfect for use, it is tried by the inventor to develop an improved quick release connecting device to enable convenient and repeated assembling and separation of a circuit board, a drawer, a window, etc. to and from a corresponding rack, chassis, cabinet, window frame, etc.

A primary objective of the present disclosure is to provide a quick release connecting device that includes an actuating retainer and a fixing member limitedly movably assembled to each other, so that a second object, such as a circuit board, a drawer or a window, detachably connected to a first object, such as a rack, a chassis, a cabinet or a window frame, via the actuating retainer and the fixing member can be conveniently and repeatedly assembled to and separated from each other.

To achieve at least the above objective, the quick release connecting device according to a preferred embodiment of the present disclosure includes an actuating retainer having an internal receiving space and a retaining section for detachably engaging with a first object; a fixing member including a body portion movably associated with the receiving space and a pivot portion formed on the body portion for detachably connecting with a second object; and pin connection means connecting the body portion to the receiving space for the actuating retainer and the fixing member to move relative to each other within a limited range. Or, according to another operable embodiment, the actuating retainer includes at least one first push section, a body portion, and a retaining section for detachably engaging with a first object; the fixing member internally defines a receiving space and includes a pivot portion formed on an outer side of the receiving space; the body portion of the actuating retainer is movably received in the receiving space of the fixing member, and the pivot portion is used to movably connect to a second object; and the pin connection means enables connection of the receiving space of the fixing member to the body portion of the actuating retainer, such that the actuating retainer and the fixing member are movable relative to each other within a limited range. Further, the fixing member includes a second push section having a first push part or a second push part; the first push part or the second push part is able to push against a third object; and the push of the second push section against the third object causes a lever displacement, a rotational displacement, or a limiting displacement of the quick release connecting device, so as to release, fasten, forward move or backward move the quick release connecting device.

To achieve at least the above objective, the quick release connecting device according to another preferred embodiment of the present disclosure includes an actuating retainer and a fixing member movably assembled to the actuating retainer. The fixing member includes a pivot portion and a pivot member movably mounted to the pivot portion; and the pivot member is coupled with a second object.

In the quick release connecting device according to the other preferred embodiment of the present disclosure, the fixing member can include a limiting section and the pivot member can include a corresponding limiting section, such that the limiting section and the corresponding limiting section limit or stop each other at a specific location when the fixing member is moved or rotated.

In the quick release connecting device according to the other preferred embodiment of the present disclosure, the pivot member or the pivot portion can include a shaft. The shaft can be movably assembled to the pivot member or the pivot portion, integrally formed with the pivot member or the pivot portion, or fixedly assembled to the pivot member or the pivot portion. And, the pivot member, the pivot portion or the fixing member is connected to the shaft via a second pin connection means in the case the shaft is assembled to the pivot member or the pivot portion.

In the quick release connecting device according to the other preferred embodiment of the present disclosure, the fixing member, the pivot portion or the pivot member can have an elastic element fitted thereon. Two ends of the elastic element are separately pressed against the pivot member and the fixing member of the quick release connecting device or separately pressed against the fixing member of the quick release connecting device and the second object, such that the fixing member under a spring force of the elastic element is either automatically sprung back to its original position or limited to a fixed position.

In the quick release connecting device according to the other preferred embodiment of the present disclosure, the pivot member can be provided with a directional section for engaging with a corresponding directional section on the second object, so as to limit the pivot member to specific directions or to restrict the pivot member from rotating or moving.

In the quick release connecting device according to the other preferred embodiment of the present disclosure, the fixing member can include a limiting section and the second object can include a corresponding limiting section, such that the limiting section and the corresponding limiting section limit or stop each other at a specific location when the fixing member is moved or rotated.

In the quick release connecting device according to the other preferred embodiment of the present disclosure, the pivot member can have a weldable surface, which can be heated and welded to the second object.

In the quick release connecting device according to the other preferred embodiment of the present disclosure, the pivot member can have a material retaining space formed thereon. And, some material of the second object is forced or flows into the material retaining space when the pivot member is press-fitted onto the second object under an external force applied thereto.

In the quick release connecting device according to the other preferred embodiment of the present disclosure, the pivot member can have a portion that is deformable under an external force applied thereto, so that the deformed portion of the pivot member is abutted on or interfered with the second object.

In the quick release connecting device according to the other preferred embodiment of the present disclosure, an elastic member, a friction-increasing member or a friction-decreasing member can be further provided. The elastic member, the friction-increasing member or the friction-decreasing member can be disposed between the fixing member and the pivot portion, between the fixing member and the pivot member, between the pivot portion and the second object, between the pivot portion and the pivot member, between pivot member and the second object, or between the fixing member and the second object.

To achieve at least the above objective, the quick release connecting device according to a further preferred embodiment of the present disclosure includes an actuating retainer and a fixing member movably assembled to the actuating retainer. The fixing member includes a pivot portion and a pivot member movably mounted to the pivot portion; and the pivot member is coupled with a second object. The pivot portion or the pivot member includes a shaft, and the shaft can be movably assembled to the pivot member or the pivot portion, integrally formed with the pivot member or the pivot portion, or fixedly assembled to the pivot member or the pivot portion.

In the quick release connecting device according to the further preferred embodiment of the present disclosure, the fixing member can include a limiting section and the pivot member can include a corresponding limiting section; such that the limiting section and the corresponding limiting section limit or stop each other at a specific location when the fixing member is moved or rotated.

In the quick release connecting device according to the further preferred embodiment of the present disclosure, the pivot member, the pivot portion or the fixing member can be connected to the shaft via a second pin connection means in the case the shaft is assembled to the pivot member or the pivot portion.

In the quick release connecting device according to the further preferred embodiment of the present disclosure, the fixing member, the pivot portion or the pivot member can have an elastic element fitted thereon. Two ends of the elastic element are separately pressed against the pivot member and the fixing member of the quick release connecting device or separately pressed against the fixing member of the quick release connecting device and the second object, such that the fixing member under a spring force of the elastic element is either automatically sprung back to its original position or limited to a fixed position.

In the quick release connecting device according to the further preferred embodiment of the present disclosure, the pivot member can be provided with a directional section for engaging with a corresponding directional section on the second object, so as to limit the pivot member to specific directions or to restrict the pivot member from rotating or moving.

In the quick release connecting device according to the further preferred embodiment of the present disclosure, the fixing member can include a limiting section and the second object can include a corresponding limiting section, such that the limiting section and the corresponding limiting section limit or stop each other at a specific location when the fixing member is moved or rotated.

In the quick release connecting device according to the further preferred embodiment of the present disclosure, the pivot member can have a weldable surface, which can be heated and welded to the second object.

In the quick release connecting device according to the further preferred embodiment of the present disclosure, the pivot member can have a material retaining space formed thereon. And, some material of the second object is forced or flows into the material retaining space when the pivot member is press-fitted onto the second object under an external force applied thereto.

In the quick release connecting device according to the further preferred embodiment of the present disclosure, the pivot member can have a portion that is deformable under an external force applied thereto, so that the deformed portion of the pivot member is abutted on or interfered with the second object.

In the quick release connecting device according to the further preferred embodiment of the present disclosure, an elastic member, a friction-increasing member or a friction-decreasing member can be further provided. The elastic member, the friction-increasing member or the friction-decreasing member can be disposed between the fixing member and the pivot portion, between the fixing member and the pivot member, between the pivot portion and the second object, between the pivot portion and the pivot member, between pivot member and the second object, or between the fixing member and the second object.

To achieve the above and other objects, the quick release connecting device according to a still further preferred embodiment of the present disclosure includes an actuating retainer and a fixing member movably assembled to the actuating retainer. The fixing member includes a pivot portion and a pivot member movably mounted to the pivot portion. A floating amount is allowable between the quick release connecting device and the second object, between the pivot portion and the pivot member, between the fixing member and the second object, between the fixing member and the pivot member, or between different angular positions of the fixing member.

In the quick release connecting device according to the still further preferred embodiment of the present disclosure, the fixing member can include a limiting section and the pivot member can include a corresponding limiting section, such that the limiting section and the corresponding limiting section limit or stop each other at a specific location when the fixing member is moved or rotated.

In the quick release connecting device according to the still further preferred embodiment of the present disclosure, the pivot member or the pivot portion can include a shaft. The shaft can be movably assembled to the pivot member or the pivot portion, integrally formed with the pivot member or the pivot portion, or fixedly assembled to the pivot member or the pivot portion. And, the pivot member, the pivot portion or the fixing member can be connected to the shaft via a second pin connection means in the case the shaft is assembled to the pivot member or the pivot portion.

In the quick release connecting device according to the still further preferred embodiment of the present disclosure, the fixing member, the pivot portion or the pivot member can have an elastic element fitted thereon. Two ends of the elastic element are separately pressed against the pivot member and the fixing member of the quick release connecting device or separately pressed against the fixing member of the quick release connecting device and the second object, such that the fixing member under a spring force of the elastic element is either automatically sprung back to its original position or limited to a fixed position.

In the quick release connecting device according to the still further preferred embodiment of the present disclosure, the pivot portion or the pivot member can include a shaft, and the shaft can be movably assembled to the pivot portion or the pivot member, integrally formed with the pivot portion or the pivot member, or fixedly assembled to the pivot member or the pivot portion.

In the quick release connecting device according to the still further preferred embodiment of the present disclosure, the pivot member can be provided with a directional section for engaging with a corresponding directional section on the second object, so as to limit the pivot member to specific directions or to restrict the pivot member from rotating or moving.

In the quick release connecting device according to the still further preferred embodiment of the present disclosure, the fixing member can include a limiting section and the second object can include a corresponding limiting section, such that the limiting section and the corresponding limiting section limit or stop each other at a specific location when the fixing member is moved or rotated.

In the quick release connecting device according to the still further preferred embodiment of the present disclosure, the pivot member can have a weldable surface, which can be heated and welded to the second object.

In the quick release connecting device according to the still further preferred embodiment of the present disclosure, the pivot member can have a material retaining space formed thereon. And, some material of the second object is forced or flows into the material retaining space when the pivot member is press-fitted onto the second object under an external force applied thereto.

In the quick release connecting device according to the still further preferred embodiment of the present disclosure, the pivot member can have a portion that is deformable under an external force applied thereto, so that the deformed portion of the pivot member is abutted on or interfered with the second object.

In the quick release connecting device according to the still further preferred embodiment of the present disclosure, an elastic member, a friction-increasing member or a friction-decreasing member can be further provided. The elastic member, the friction-increasing member or the friction-decreasing member can be disposed between the fixing member and the pivot portion, between the fixing member and the pivot member, between the pivot portion and the second object, between the pivot portion and the pivot member, between pivot member and the second object, or between the fixing member and the second object.

In the quick release connecting device according to the still further preferred embodiment of the present disclosure, the floating amount allowable between the quick release connecting device and the second object, between the pivot portion and the pivot member, between the fixing member and the second object, between the fixing member and the pivot member, or between different angular positions of the fixing member can be a vertically pivotal floating amount.

In the quick release connecting device according to the still further preferred embodiment of the present disclosure, the floating amount allowable between the quick release connecting device and the second object, between the pivot portion and the pivot member, between the fixing member and the second object, between the fixing member and the pivot member, or between different angular positions of the fixing member can be a horizontally pivotal floating amount.

In the quick release connecting device according to the still further preferred embodiment of the present disclosure, the floating amount allowable between the quick release connecting device and the second object, between the pivot portion and the pivot member, between the fixing member and the second object, between the fixing member and the pivot member, or between different angular positions of the fixing member can be a vertically linear floating amount.

In the quick release connecting device according to the still further preferred embodiment of the present disclosure, the floating amount allowable between the quick release connecting device and the second object, between the pivot portion and the pivot member, between the fixing member and the second object, between the fixing member and the pivot member, or between different angular positions of the fixing member can be a horizontally linear floating amount.

To achieve the above and other objects, the quick release connecting device according to another further preferred embodiment of the present disclosure includes an actuating retainer and a fixing member movably assembled to the actuating retainer via pin connection means. The actuating retainer includes a retaining section and a force application section, and the fixing member includes a handle portion located corresponding to the force application section for operating the force application section, such that the retaining section is engaged with an object. And, the fixing member further includes a pivot portion.

To achieve the above and other objects, the quick release connecting device according to a still another further preferred embodiment of the present disclosure includes an actuating retainer and a fixing member movably assembled to the actuating retainer. The actuating retainer includes a retaining section and a force application section, and the fixing member includes a handle portion located corresponding to the force application section for operating the force application section, such that the retaining section is engaged with an object. And, the fixing member further includes a pivot portion.

To achieve the above and other objects, the quick release connecting device according to a further preferred embodiment of the present disclosure includes an actuating retainer and a fixing member movably assembled to the actuating retainer via pin connection means. The actuating retainer includes a retaining section a force application section, and the fixing member includes a handle portion located corresponding to the force application section for operating the force application section, such that the retaining section is engaged with a first object. The fixing member further includes a pivot portion and a clamp portion; the pivot portion has a pivot member movably mounted thereto for connecting to a second object; and the clamp portion is used to engage with the first object or a third object.

To achieve the above and other objects, the quick release connecting device according to a still further preferred embodiment of the present disclosure includes an actuating retainer and a fixing member movably assembled to the actuating retainer. The actuating retainer includes a retaining section and a force application section, and the fixing member includes a handle portion located corresponding to the force application section for operating the force application section, such that the retaining section is engaged with a first object. The fixing member further includes a pivot portion and a clamp portion, the pivot portion has a pivot member movably mounted thereto for connecting to a second object, and the clamp portion is used to engage with the first object or a third object.

In the above embodiments, the actuating retaining of the quick release connecting device includes a receiving space and the fixing member is received in the receiving space; and the pin connection means is transversely extended through the receiving space of the actuating retainer and through the fixing member for the fixing member to be movably assembled to the actuating retainer.

In the above embodiments, the fixing member includes a body portion, which is extended through the receiving space of the actuating retainer.

In the above embodiments, the quick release connecting device further includes an elastic element, which has an end limited in place by the actuating retainer and another end pressed against the fixing member.

In the above embodiments, the actuating retainer includes an abutting section and the fixing member includes a holding portion that is located corresponding to the abutting section. And, the elastic element is disposed in the abutting section with one end limited in place by the abutting section and the other end pressed against the holding portion of the fixing member.

In the above embodiments, the clamp portion of the fixing member includes a first protruded jaw and a second protruded jaw. And, the first object or the third object engaged with the clamp portion is located in between the first protruded jaw and the second protruded jaw.

In the above embodiments, the actuating retainer includes a first limiting section and a second limiting section. The first limiting section is located at a top inner side of the actuating retainer and the second limiting section is located at a bottom inner side of the actuating retainer, such that the first limiting section or the second limiting section will finally abut on the fixing member to limit the actuating retainer from moving further when the actuating retainer is moved relative to the fixing member.

In the above embodiments, the handle portion of the fixing member is a bar extended beyond an end of the actuating retainer located opposite to the pivot portion.

In the above embodiments, the handle portion of the fixing member is a bar located between the actuating retainer and the pivot portion.

In the above embodiments, the handle portion of the fixing member is a closed grip formed by a bar located between the actuating retainer and the pivot portion.

To use the quick release connecting device of the present disclosure, first movably connect the pivot portion of the fixing member to the second object, such as a circuit board, a drawer or a window. Since the actuating retainer and the fixing member are movably assembled to each other, at least one of them can be quickly detachably engaged with at least a first object, such as a chassis, a rack, a cabinet or a window frame. More specifically, the retaining section of the actuating retainer and/or the second push section of the fixing member can be quickly detachably engaged with the first object to thereby quickly connect the second object to the first object. On the other hand, to separate the second object from the first object, simply push the first push section for the retaining section to disengage from the first object and pivotally turn the fixing member for the second push section to push away the first object, and the second object is easily separated from the first object. Therefore, with the quick release connecting device of the present disclosure, the second object can be repeatedly quickly assembled to and separated from the first object.

DETAILED DESCRIPTION OF THE INVENTION

Figure 1:
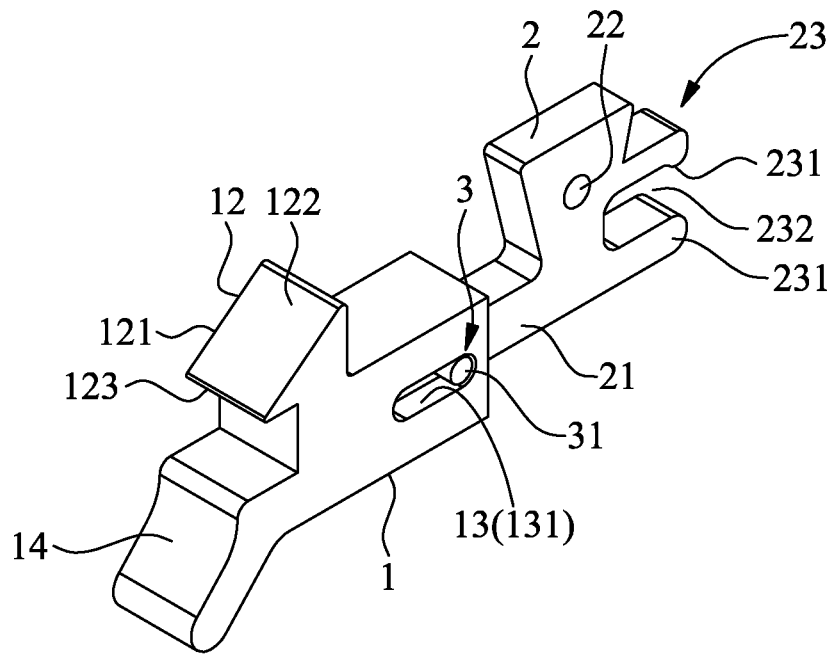
FIG. 1 is an assembled perspective view of a quick release connecting device according to a first preferred embodiment of the present disclosure.

To facilitate understanding of the objects, characteristics and effects of this present disclosure, embodiments together with the attached drawings for the detailed description of the present disclosure are provided. It is noted the present disclosure can be implemented or applied in other embodiments, and many changes and modifications in the described embodiments can be carried out without departing from the spirit of the disclosure, and it is also understood that the preferred embodiments are only illustrative and not intended to limit the present disclosure in any way. For the purpose of easy to understand, elements that are the same in the preferred embodiments are denoted by the same reference numerals.

Figure 10:
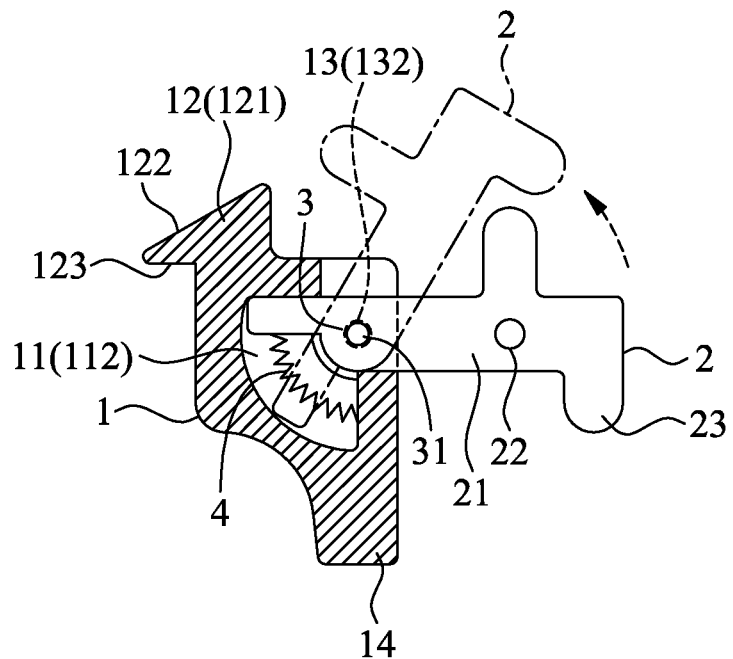
FIG. 10 is an assembled partially sectioned front view of a quick release connecting device according to a second preferred embodiment of the present disclosure.
Figure 11:
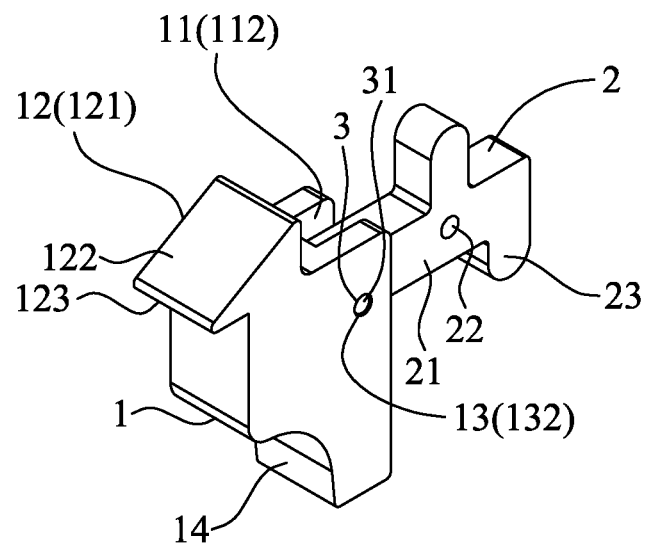
FIG. 11 is an assembled perspective view of the quick release connecting device according to the second preferred embodiment of the present disclosure.
Figure 12:
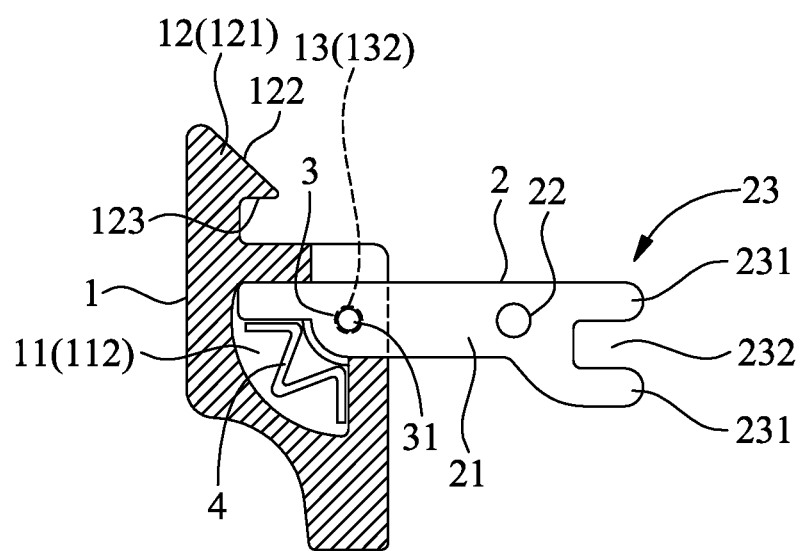
FIG. 12 is an assembled partially sectioned front view of a variant of the second preferred embodiment of the present disclosure, showing an elastic plate and a different retaining section are included in the quick release connecting device.
Figure 13A:
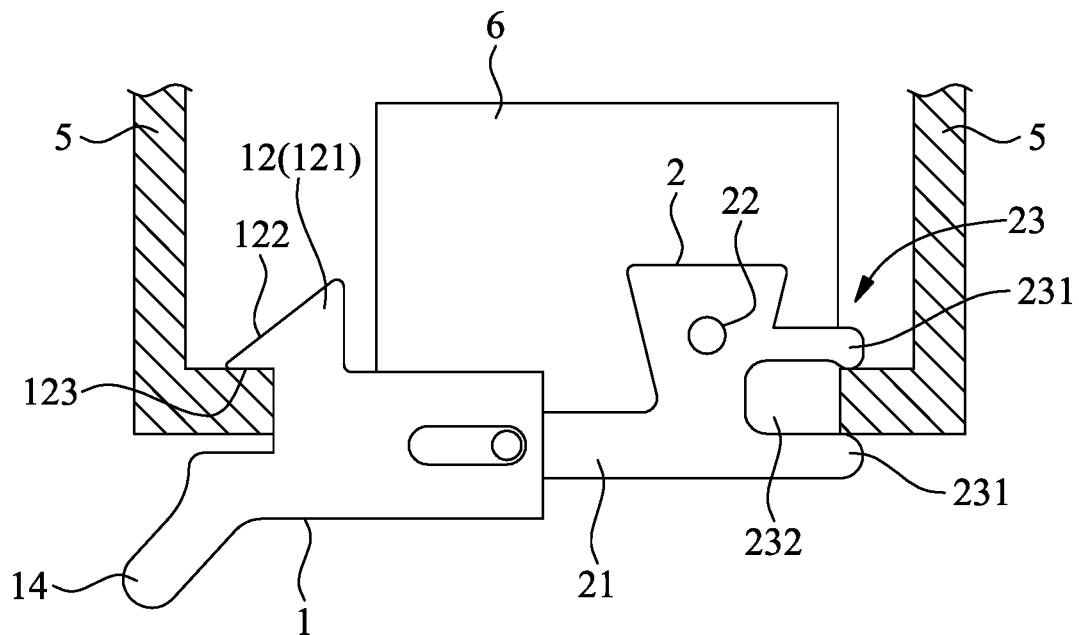
FIG. 13A shows the quick release connecting device according to the first preferred embodiment of the present disclosure is connected to two objects and can be operated to quickly release the two objects from each other.
Figure 13B:
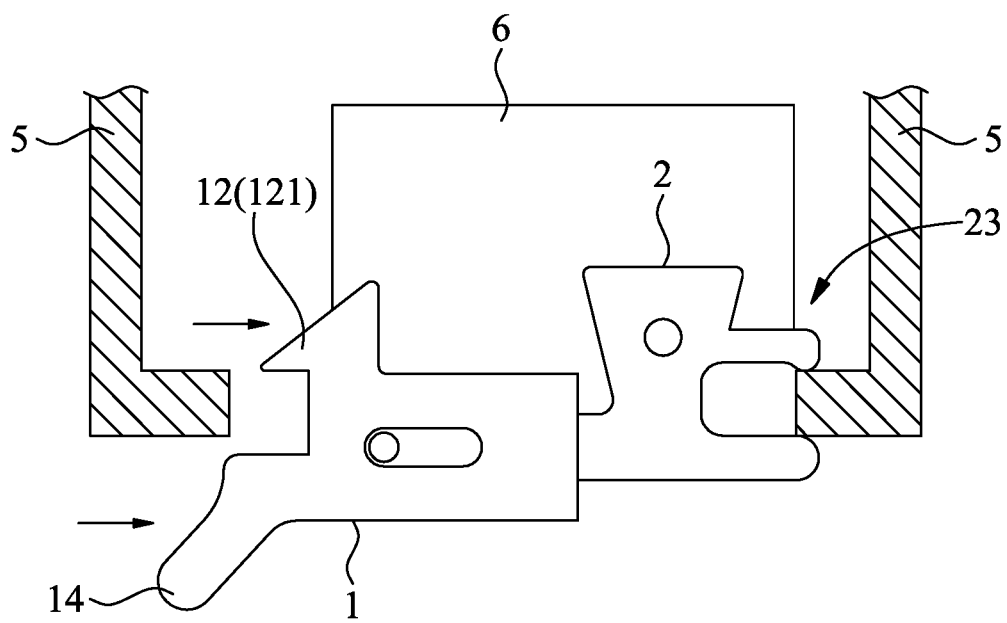
FIG. 13B also shows the quick release connecting device according to the first preferred embodiment of the present disclosure is connected to two objects and can be operated to quickly release the two objects from each other.

FIGS. 1 to 9 show a quick release connecting device according to a first preferred embodiment of the present disclosure, which is configured to enable limited slide, i.e. to slide within a limited range; and FIGS. 10 to 12 show a quick release connecting device according to a second preferred embodiment of the present disclosure, which is configured to enable limited rotation, i.e. to rotate within a limited angle. As shown, in both of the first and second preferred embodiments, the quick release connecting device of the present disclosure includes an actuating retainer 1 and a fixing member 2 movably assembled to the actuating retainer 1. The actuating retainer 1 can be made of a plastic material or a metal material; it internally defines a receiving space 11 and includes a retaining section 12 for detachably engaging with a first object 5 and at least one first push section 14. The fixing member 2 can be made of a plastic material or a metal material; it includes a body portion 21 and a pivot portion 22 formed on an outer end of the body portion 21. The body portion 21 has an inner end movably associated with the receiving space 11 of the actuating retainer 1; and the pivot portion 22 is located outside the receiving space 11 for detachably connecting with a second object 6. The first push section 14 can be a protrusion outward projected from any side of the actuating retainer 1. As shown in FIG. 13B, by applying a force against the first push section 14, the actuating retainer 1 can be moved to release the retaining section 12 from the first object 5, allowing the second object 6 to separate from the first object 5. The quick release connecting device according to the first and the second preferred embodiment of the present disclosure further include pin connection means 3. The pin connection means 3 enables connection of the body portion 21 of the fixing member 2 to the receiving space 11 of the actuating retainer 1, such that the actuating retainer 1 and the fixing member 2 in the first and the second preferred embodiment are slidable and rotatable, respectively, relative to each other within a limited range and angle. The quick release connecting device according to the first and the second preferred embodiment of the present disclosure can further include an elastic element 4, which is disposed in the receiving space 11 of the actuating retainer 1, or can be disposed at a selected position, with an end pressed against an inner wall surface of the receiving space 11 and another opposite end against the body portion 21 of the fixing member 2. The elastic element 4 enables and controls limited sliding or rotation of the actuating retainer 1 and the fixing member 2 relative to each other, and can elastically push the actuating retainer 1 and the fixing member 2 back to their original positions.

Figure 5A:
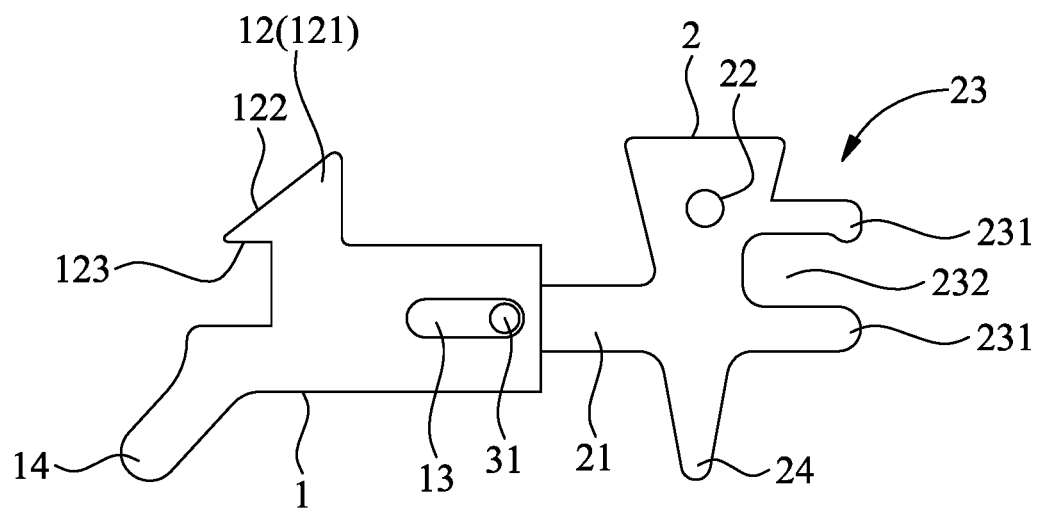
FIG. 5A shows a first variant of the quick release connecting device according to the first preferred embodiment of the present disclosure, showing it further includes a handle section.
Figure 5B:
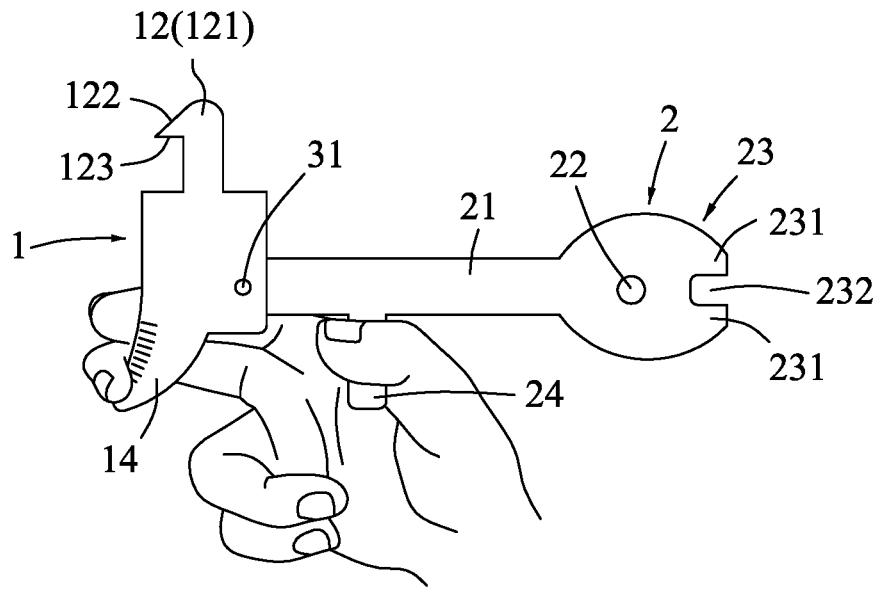
FIG. 5B shows the operation of the quick release connecting device according to the first preferred embodiment of the present disclosure.
Figure 5C:
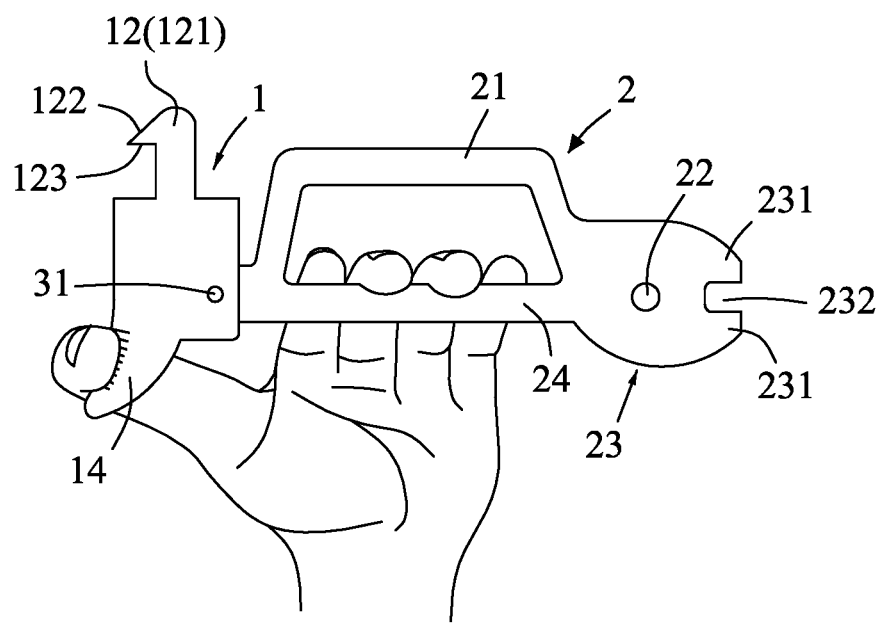
FIG. 5C also shows the operation of the quick release connecting device according to the first preferred embodiment of the present disclosure.

Please refer to FIGS. 5A and 5B that show a first variant of the first preferred embodiment of the present disclosure further includes a handle section 24 provided on the body portion 21 of the fixing member 2. The handle section 24 can be a protrusion downward projected from a lower side of the body portion 21. The handle section 24 and the first push section 14 are preferably directed to the same direction. For example, the handle section 24 and the first push section 14 are directed downward. With this arrangement, a user may conveniently move the actuating retainer 1 toward the fixing member 2 by pressing one finger, such as the thumb, against an axially outer side (i.e. the left side in the drawing) of the first push section 14 while pressing another finger, such as the index finger and/or the middle finger, against an axially outer side (i.e. the right side in the drawing) of the handle section 24, as shown in FIGS. 5A and 5B. Alternatively, the user may press against the first push section 14 with one finger, such as the thumb, while firmly holding the handle section 24 with another finger or the other four fingers, so as to conveniently move the actuating retainer 1 toward the fixing member 2, as shown in FIG. 5C. In this case, the handle section 24 is a closed grip formed by a bar located between the actuating retainer 1 and the pivot portion 22.

Figure 6:
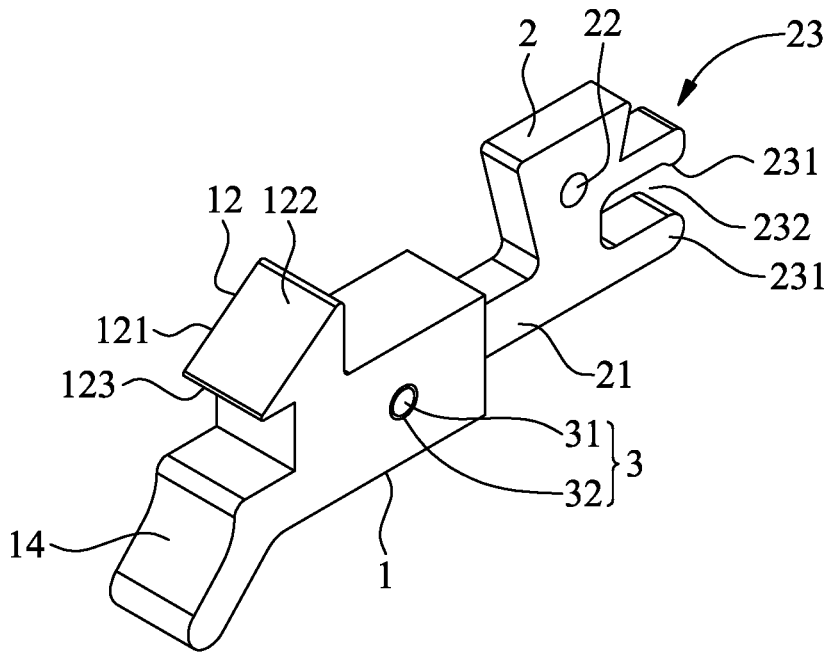
FIG. 6 is an assembled perspective view of a second variant of the first preferred embodiment of the present disclosure.
Figure 7:
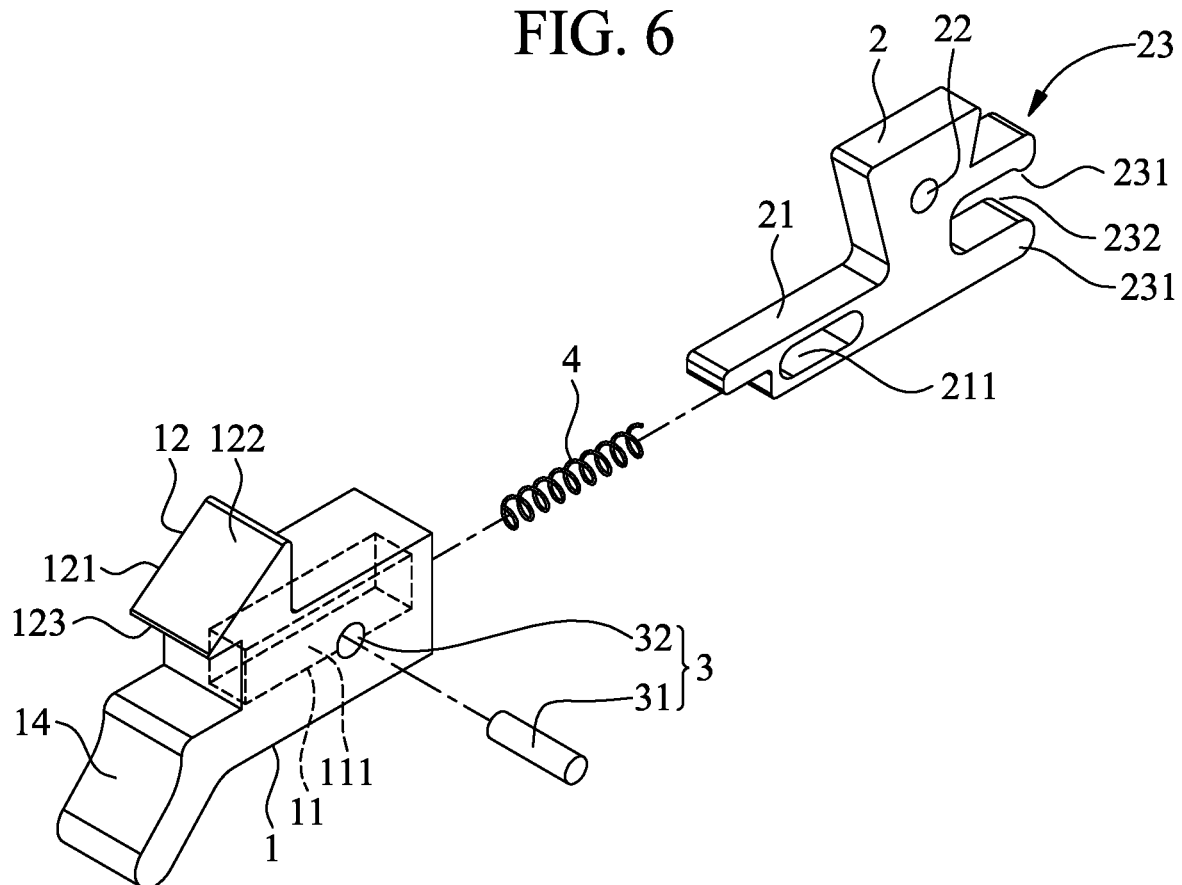
FIG. 7 is an exploded view of FIG. 6.
Figure 8:
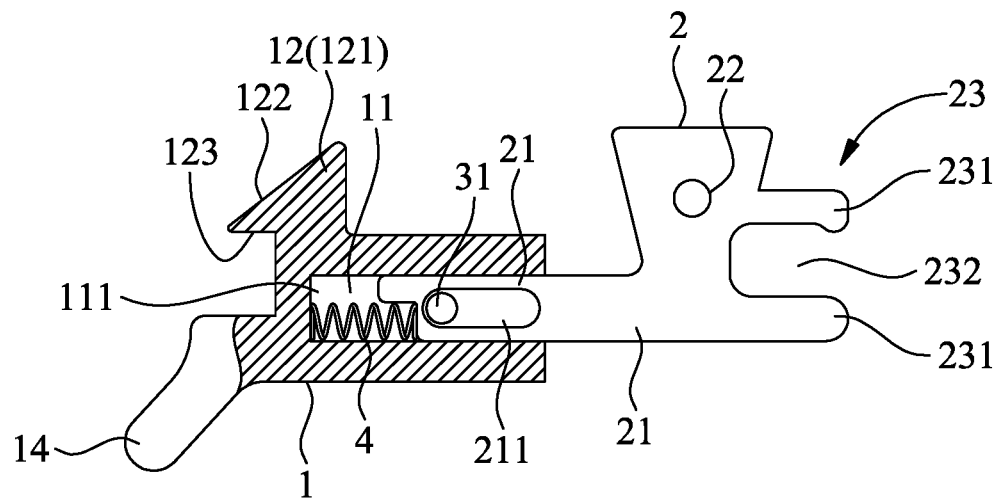
FIG. 8 is a partially sectioned front view of FIG. 6.
Figure 9:
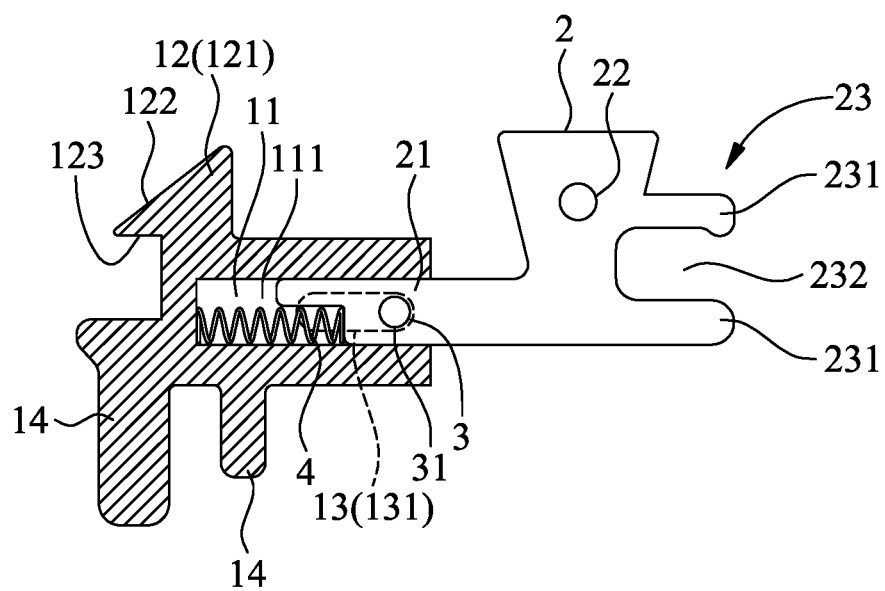
FIG. 9 is a partially sectioned front view of a third variant of the first preferred embodiment of the present disclosure, showing two first push sections are included in the quick release connecting device.

Please refer to FIGS. 1 to 4, in which the quick release connecting device according to the first preferred embodiment of the present disclosure is shown. As shown, in the first preferred embodiment, the actuating retainer 1 and the fixing member 2 are held to each other via the pin connection means 3 to allow limited sliding of them relative to each other, and accordingly, the retaining section 12 is slidably engaged with or released from the first object 5. More specifically, the actuating retainer 1 is internally provided with a pin connection slot 13, which communicates with the receiving space 11, and the pin connection means 3 is located in the pin connection slot 13. The pin connection slot 13 can be a long slide slot 131 formed on one or two lateral walls of the receiving space 11. When the pin connection means 3 slides in the long slide slot 131, the actuating retainer 1 and the fixing member 2 are brought to slide relative to each other within a limited range. FIGS. 6 to 8 show a second variant of the quick release connecting device according to the first preferred embodiment of the present disclosure. In the second variant, the body portion 21 of the fixing member 2 is formed with a long slide hole 211, which is communicable with the receiving space 11, and the pin connection means 3 is slidable in the long slide hole 211 to thereby bring the actuating retainer 1 and the fixing member 2 to slide relative to each other within a limited range.

Please refer to FIGS. 10 to 12, in which the quick release connecting device according to the second preferred embodiment of the present disclosure is shown. As shown, in the second preferred embodiment, the actuating retainer 1 and the fixing member 2 are held to each other via the pin connection means 3 to allow limited rotating of them relative to each other, and accordingly, the retaining section 12 is rotatably engaged with or released from the first object 5. More specifically, the actuating retainer 1 is also internally provided with a pin connection slot 13, which communicates with the receiving space 11, and the pin connection means 3 is located in the pin connection slot 13. According to an operable embodiment, the pin connection slot 13 can be a locating hole 132 formed on one or two lateral walls of the receiving space 11. When the pin connection means 3 rotates in the locating hole 132, the actuating retainer 1 and the fixing member 2 are brought to rotate relative to each other within a limited angle.

Figure 2:
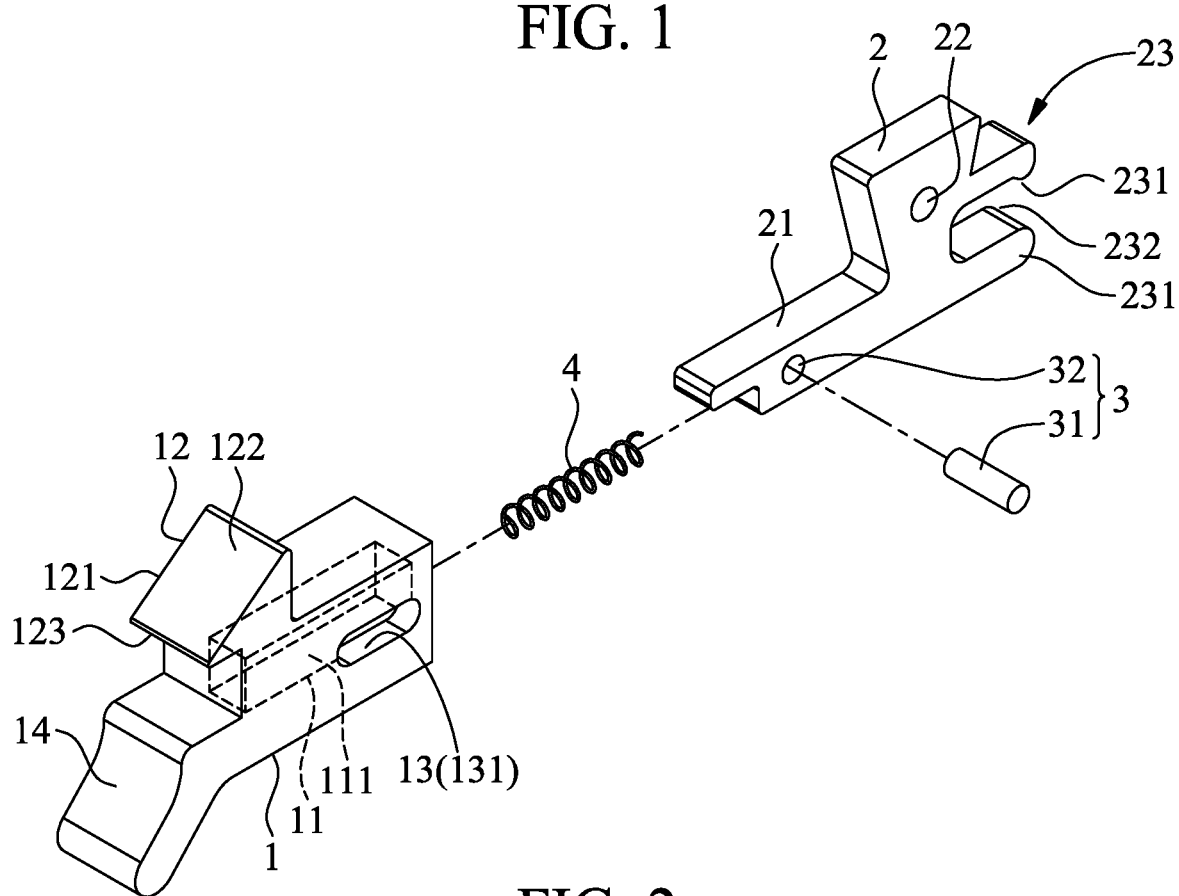
FIG. 2 is an exploded view of FIG. 1.
Figure 3:
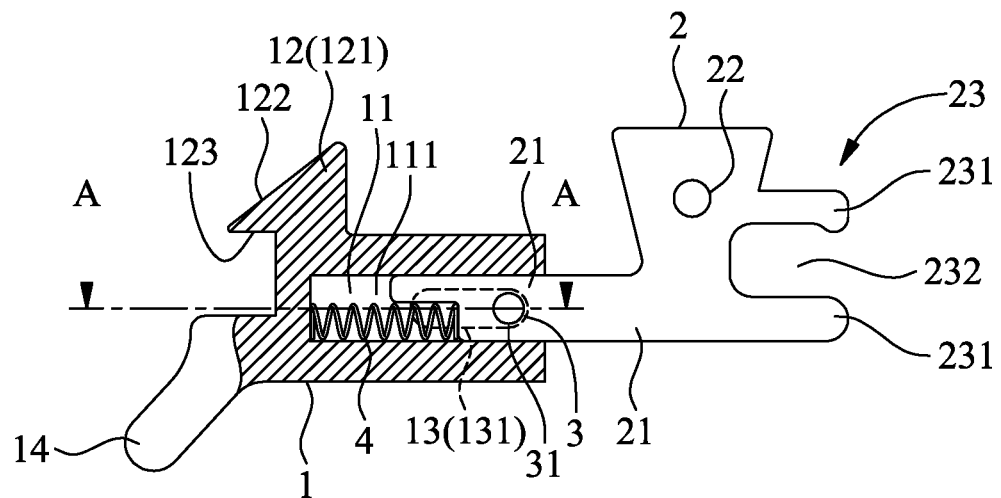
FIG. 3 is a partially sectioned front view of FIG. 1.
Figure 4:
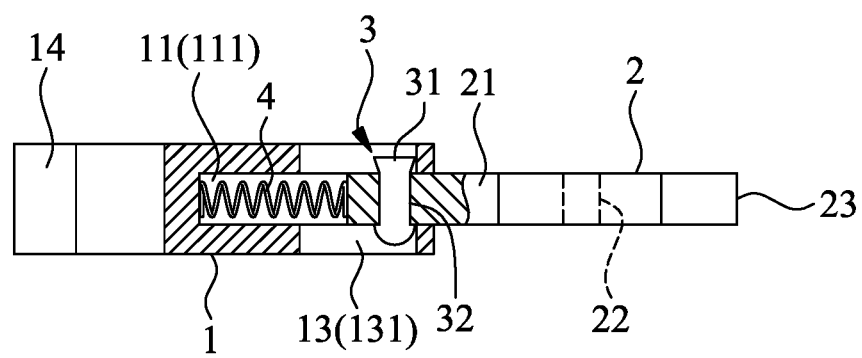
FIG. 4 is a sectional view taken along line A-A of FIG. 3.

In the first preferred embodiment, as can be seen in FIGS. 2 and 4, and in the second preferred embodiment, as can be seen in FIGS. 10 and 12, the pin connection means 3 can include a cylindrical pin 31 integrally formed with or additionally assembled to the body portion 21 of the fixing member 2, and a pin holding hole 32 formed on the body portion 21 of the fixing member 2. The cylindrical pin 31 is inserted in, snapped fitted in, riveted to, expansion-fitted in, glued to or screwed into the pin holding hole 32. Alternatively, the pin connection means 3 can include a cylindrical pin 31 integrally formed with or additionally assembled to the actuating retainer 1, and a pin holding hole 32 formed on the body portion 21 of the fixing member 2. Similarly, the cylindrical pin 31 is inserted in, snapped fitted in, riveted to, expansion-fitted in, glued to or screwed into the pin holding hole 32. By transversely and slidably setting the cylindrical pin 31 of the pin connection means 3 in the long slide slot 131 as in the first preferred embodiment, or by transversely and rotatably setting the cylindrical pin 31 of the pin connection means 3 in the locating hole 132 as in the second preferred embodiment, it is able to achieve the limited sliding or the limited rotation, respectively, of the actuating retainer 1 and the fixing member 2 relative to each other. Alternatively, in the second variant of the first preferred embodiment as shown in FIGS. 6 and 7, the pin connection means 3 includes a cylindrical pin 31 integrally formed with or additionally assembled to the actuating retainer 1 to transversely extend through the receiving space 11, and at least one pin holding hole 32 preferably formed on the actuating retainer 1 to communicate with the receiving space 11. Again, the cylindrical pin 31 is inserted in, snapped fitted in, riveted to, expansion-fitted in, glued to or screwed into the pin holding hole 32.

Please refer to FIGS. 1 to 12. In both of the first and the second preferred embodiment, the retaining section 12 on the actuating retainer 1 can be a hook 121 directed leftward (see FIGS. 1-11) or rightward (see FIG. 12) when viewing in front of the drawings. The hook 121 is preferably a triangular or wedge shaped hook protruded from the actuating retainer 1, and it includes a beveled guide surface 122 and a hooking surface 123 connected to a lower edge of the beveled guide surface 122. As can be seen in FIG. 13A, the beveled guide surface 122 allows the actuating retainer 1 to be conveniently pressed into the first object 5, and the hooking surface 123 can firmly abut on an inner side of the first object 5 after the beveled guide surface 122 has been moved into the first object 5.

In the first preferred embodiment shown in FIGS. 1 to 9, the fixing member 2 preferably includes at least one second push section 23. As illustrated in the drawings, the second push section 23 can be lying U-shaped to include two jaws 231 formed on an outer end thereof and a holding cavity 232 defined between the two jaws 231. Referring to FIG. 13A, the two jaws 231 and the holding cavity 232 of the second push section 23 can be used to hold the first object 5 thereto. When it is desired to release the second object 6 from the first object 5, simply turn the quick release connecting device as a lever to push the first object 5 out of the second push section 23, and the second object 6 can be easily released from the first object 5.

In the first preferred embodiment shown in FIGS. 1 to 9, the pivot portion 22 of the fixing member 2 is preferably a protruded block, a retaining block or a through hole integrally formed with or additionally assembled to the body portion 21. As shown in FIG. 13A, the quick release connecting device of the present disclosure can be movably connected to the second object 6 via the protruded block, the retaining block or the through hole. Preferably, the pivot portion 22 can be inserted in, snapped fitted onto, riveted to, expansion-fitted onto or screwed to the second object 6, so that the quick release connecting device and the second object 6 are rotatably connected to each other.

In the first preferred embodiment shown in FIGS. 1 to 9, the receiving space 11 in the actuating retainer 1 includes a straight and rectangular-sectioned slide space 111. The inner end of the body portion 21 of the fixing member 2 is extended into the slide space 111 and is slidably held therein via the pin connection means 3, so that the actuating retainer 1 and the fixing member 2 are able to slide relative to each other within a limited range. The elastic element 4 is preferably a coil spring, as shown in FIGS. 2 to 6, but it can also be an elastic plate or an elastic bar. The elastic element 4 is disposed in the slide space 111 with an end pressed against an inner wall surface of the slide space 111 and another end pressed against the body portion 21, such that the actuating retainer 1 and the fixing member 2 can slide relative to each other within a limited range and then return to their respective original position under the elastic force of the elastic element 4.

In the second preferred embodiment shown in FIGS. 10 to 12, the receiving space 11 in the actuating retainer 1 includes an arcuate slide space 112. The inner end of the body portion 21 of the fixing member 2 is extended into the arcuate slide space 112 and is rotatably held therein via the pin connection means 3, so that the actuating retainer 1 and the fixing member 2 are able to rotate relative to each other within a limited angle. The elastic element 4 is preferably a coil spring, as shown in FIG. 10, but it can also be an elastic plate as shown in FIG. 12 or an elastic bar (not shown). The elastic element 4 is disposed in the arcuate slide space 112 with an end pressed against an inner wall surface of the slide space 112 and another end pressed against the body portion 21, such that the actuating retainer 1 and the fixing member 2 can rotate relative to each other within a limited angle and then return to their respective original position under the elastic force of the elastic element 4.

Figure 13C:
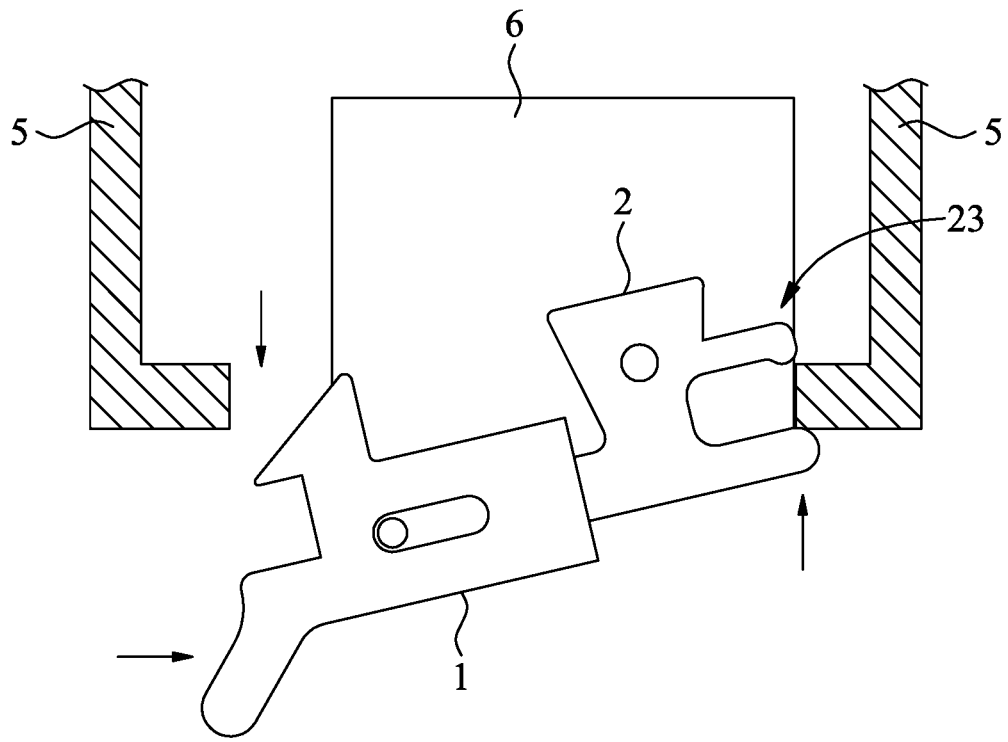
FIG. 13C also shows the quick release connecting device according to the first preferred embodiment of the present disclosure is connected to two objects and can be operated to quickly release the two objects from each other.
Figure 13D:
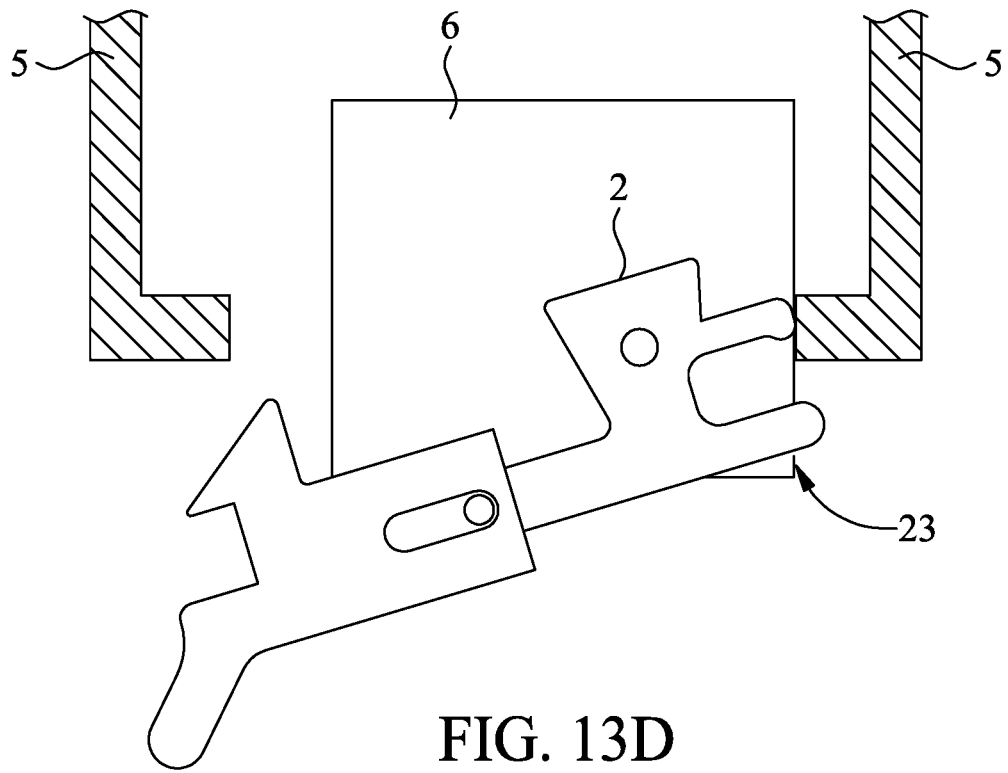
FIG. 13D also shows the quick release connecting device according to the first preferred embodiment of the present disclosure is connected to two objects and can be operated to quickly release the two objects from each other.

The first object 5 can be a rack, a chassis, a cabinet for drawers, a window frame or other objects; and the second object 6 can be a circuit board, a drawer, a window or other objects. FIG. 13A shows the quick release connecting device according to the first preferred embodiment of the present disclosure is movably assembled to the second object 6 via the pivot portion 22 of the fixing member 2. Meanwhile, the retaining section 12 of the actuating retainer 1 and the second push section 23 of the fixing member 2 are detachably engaged with two opposite sides of the first object 5, so that the second object 6 is located in and sidewardly movably connected to the first object 5 via the quick release connecting device. When it is desired to separate the second object 6 from the first object 5, as indicated by FIG. 13B, simply push the first push section 14 of the actuating retainer 1 with one hand, so that the actuating retainer 1 slides toward the fixing member 2 by a limited range to separate the retaining section 12 from one side of the first object 5. Then, as shown in FIG. 13C, utilize the principle of leverage to push the quick release connecting device for the fixing member 2 to rotate about the pivot portion 22, bringing the second push section 23 to push the other side of the first object 5 away from it. At this point, the second object 6 can be pulled to slide out of the first object 5. Finally, as shown in FIG. 13D, when the second object 6 is separated from the first object 5 and the first push section 14 is no longer subjected to a push, the elastic element 4 automatically pushes the actuating retainer 1 to slide relative to the fixing member 2 back to its original position.

Figure 14A:
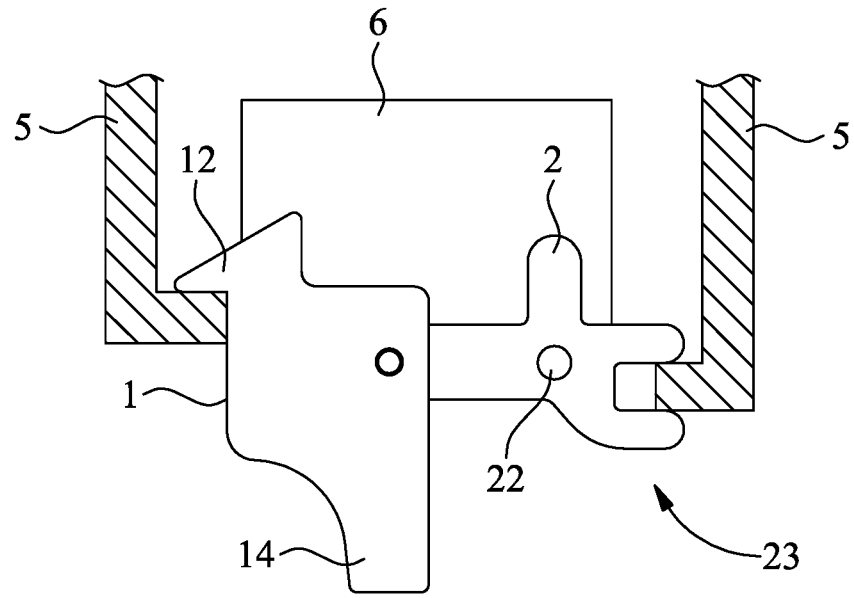
FIG. 14A shows the quick release connecting device according to the second preferred embodiment of the present disclosure is connected to two objects and can be operated to quickly release the two objects from each other.
Figure 14B:
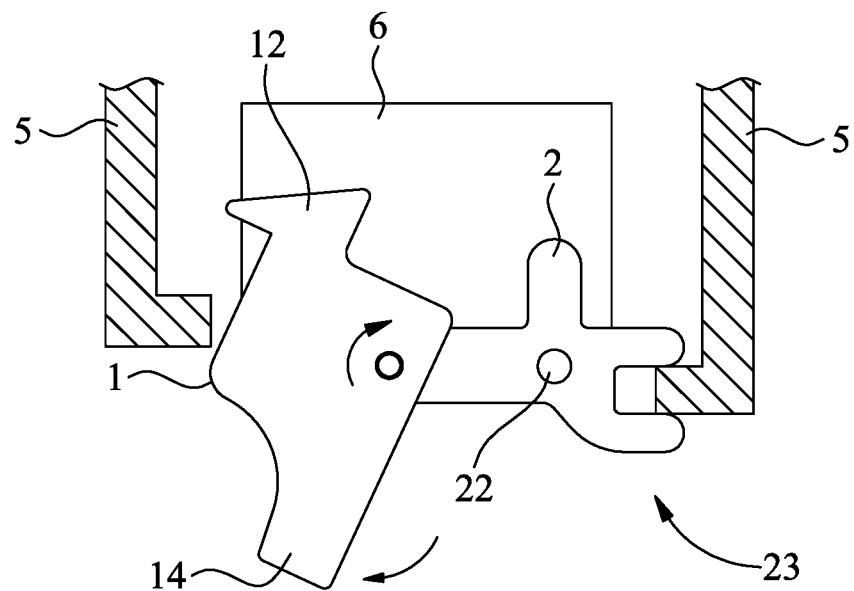
FIG. 14B also shows the quick release connecting device according to the second preferred embodiment of the present disclosure is connected to two objects and can be operated to quickly release the two objects from each other.
Figure 14C:
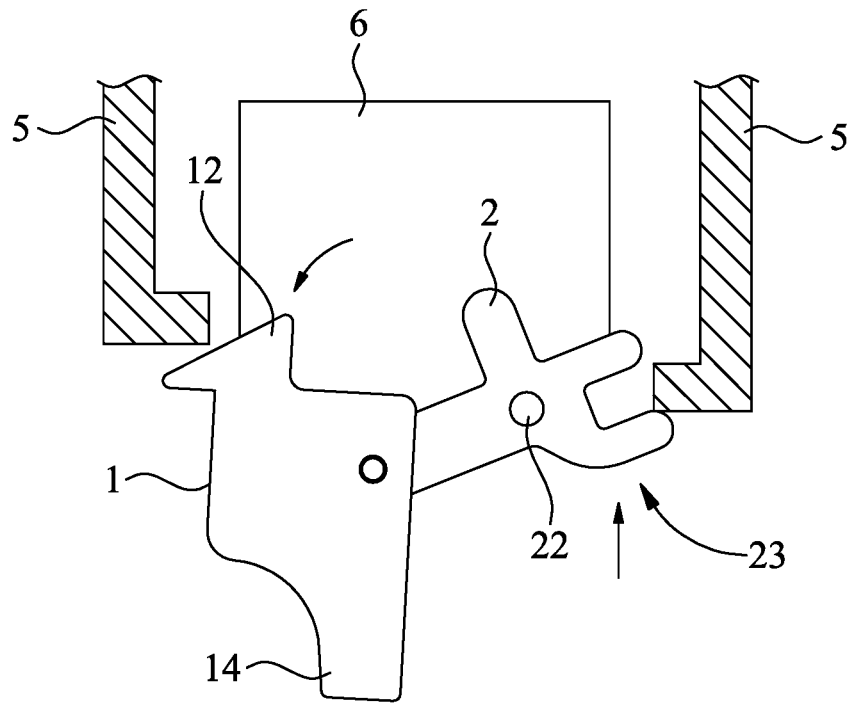
FIG. 14C also shows the quick release connecting device according to the second preferred embodiment of the present disclosure is connected to two objects and can be operated to quickly release the two objects from each other.
Figure 14D:
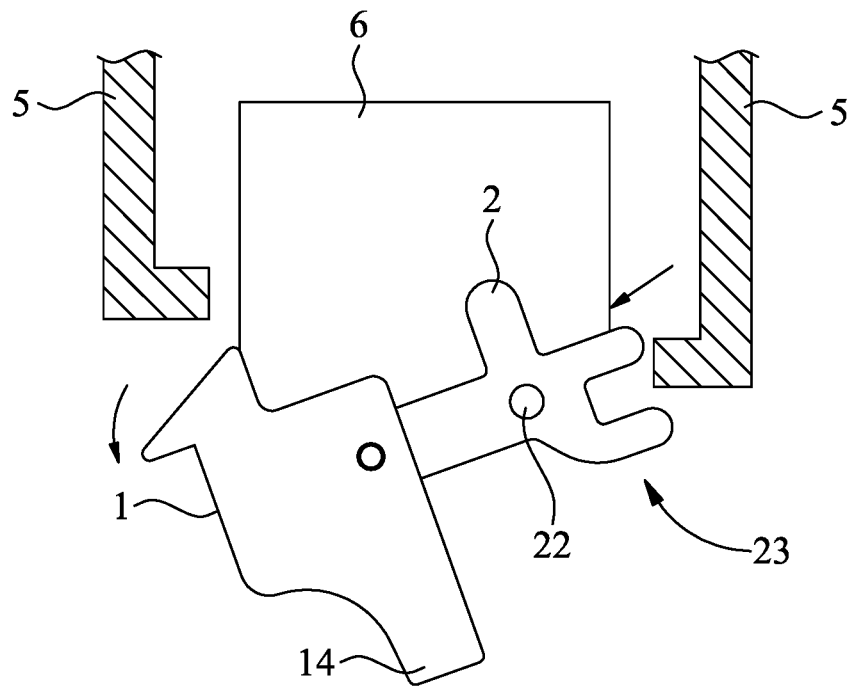
FIG. 14D also shows the quick release connecting device according to the second preferred embodiment of the present disclosure is connected to two objects and can be operated to quickly release the two objects from each other.

FIG. 14A shows the quick release connecting device according to the second preferred embodiment of the present disclosure is similarly movably assembled to the second object 6 via the pivot portion 22 of the fixing member 2. Meanwhile, the retaining section 12 of the actuating retainer 1 and the second push section 23 of the fixing member 2 are detachably engaged with two opposite sides of the first object 5, so that the second object 6 is located in and sidewardly movably connected to the first object 5 via the quick release connecting device. When it is desired to separate the second object 6 from the first object 5, as indicated by FIG. 14B, simply push the first push section 14 of the actuating retainer 1 with one hand, so that the actuating retainer 1 rotates relative to the fixing member 2 by a limited angle to separate the retaining section 12 from one side of the first object 5. Then, as shown in FIG. 14C, utilize the principle of leverage to push the quick release connecting device for the fixing member 2 to rotate about the pivot portion 22, bringing the second push section 23 to push the other side of the first object 5 away from it. At this point, the second object 6 can be pulled to slide out of the first object 5. Finally, as shown in FIG. 14D, when the second object 6 is separated from the first object 5 and the first push section 14 is no longer subjected to a push, the elastic element 4 automatically pushes the actuating retainer 1 to rotate relative to the fixing member 2 back to its original position.

Figure 15:
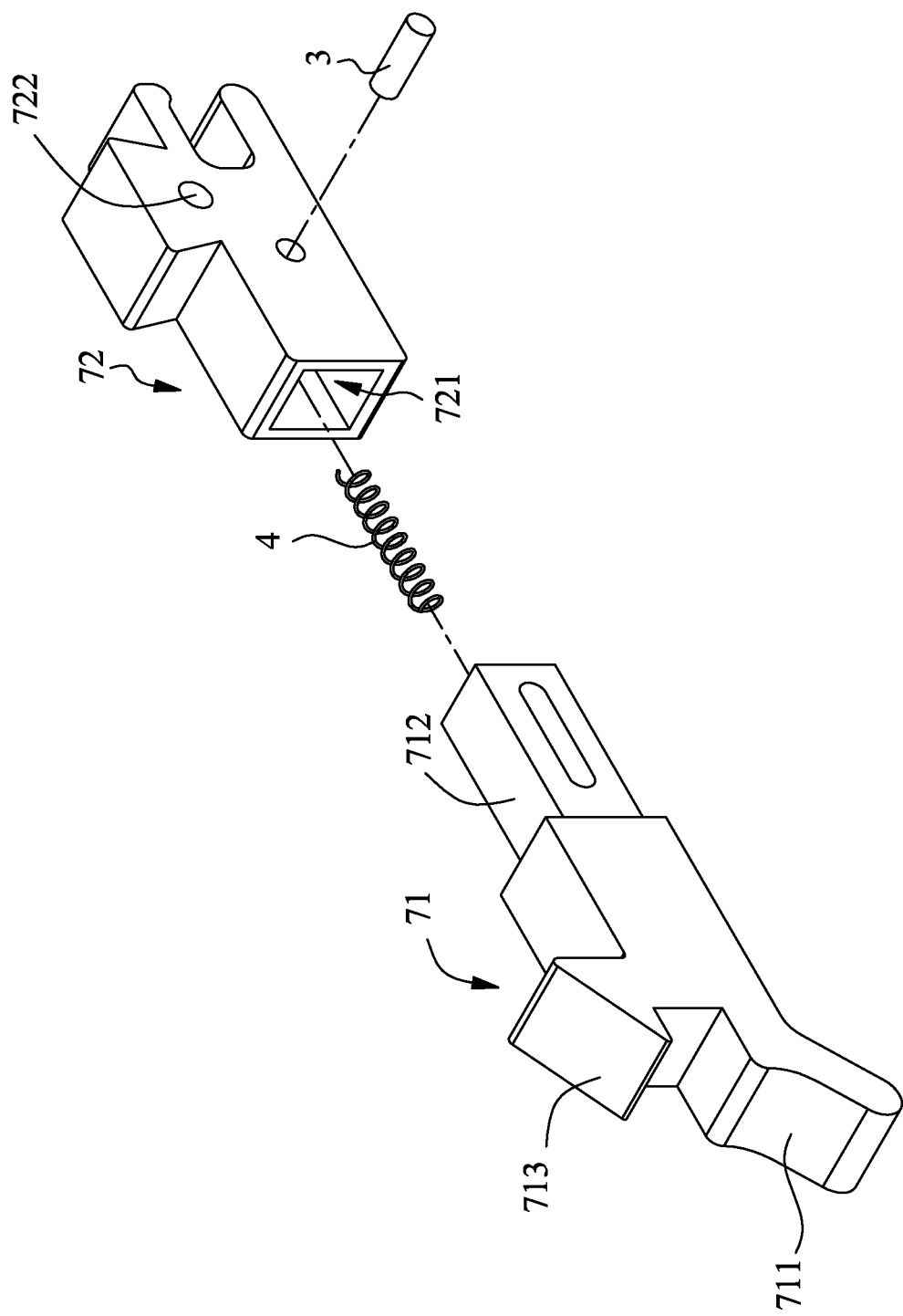
FIG. 15 is an exploded perspective view of a quick release connecting device according to a third preferred embodiment of the present disclosure.

Please refer to FIG. 15, which is an exploded perspective view of a quick release connecting device 7 according to a third preferred embodiment of the present disclosure. The quick release connecting device 7 includes an actuating retainer 71, a fixing member 72 movably assembled to the actuating retainer 71, and pin connection means 3. The actuating retainer 71 includes at least one first push section 711, a body portion 712, and a retaining section 713 for detachably engaging with a first object 5 (not shown in FIG. 15). The fixing member 72 internally defines a receiving space 721 and includes a pivot portion 722 formed on an outer side of the receiving space 721. The body portion 712 is movably received in the receiving space 721, and the pivot portion 722 is used to movably connect to a second object (not shown in FIG. 15). The pin connection means 3 enables connection of the receiving space 721 of the fixing member 72 to the body portion 712 of the actuating retainer 71, such that the actuating retainer 71 and the fixing member 72 are movable relative to each other within a limited range. The quick release connecting device 7 according to the third preferred embodiment of the present disclosure can further include an elastic element 4, which is disposed in the receiving space 721 with an end pressed against an inner wall surface of the receiving space 721 and another opposite end against the body portion 712. In this manner, the elastic element 4 enables and controls the limited movement of the actuating retainer 71 and the fixing member 72 relative to each other, and can elastically push the actuating retainer 71 and the fixing member 72 back to their original positions.

In addition, the retaining section 713 can be in the form of a hook, a recessed section, a protruded section, a stepped section, a flat surface, a cambered surface, or a curved surface.

Figure 16A:
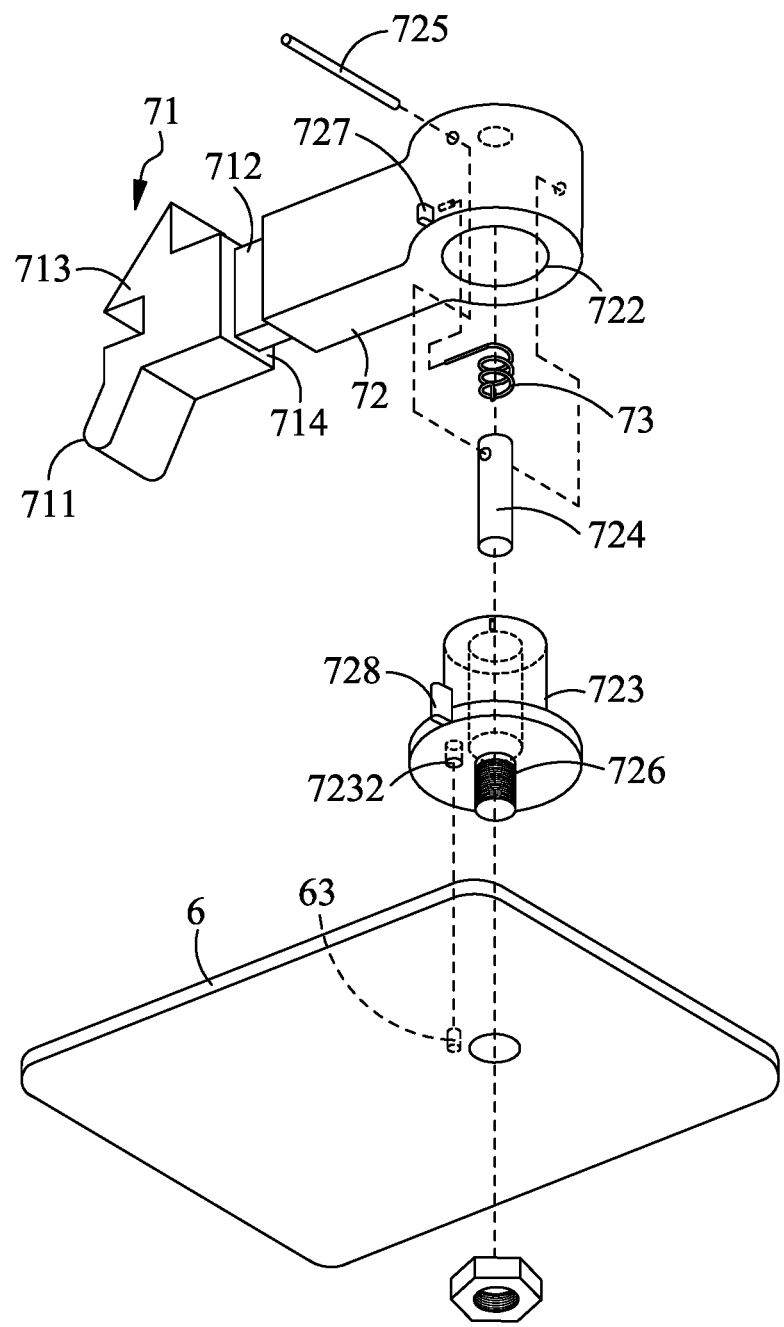
FIG. 16A is an assembled top view of a quick release connecting device according to a fourth preferred embodiment of the present disclosure.
Figure 16B:
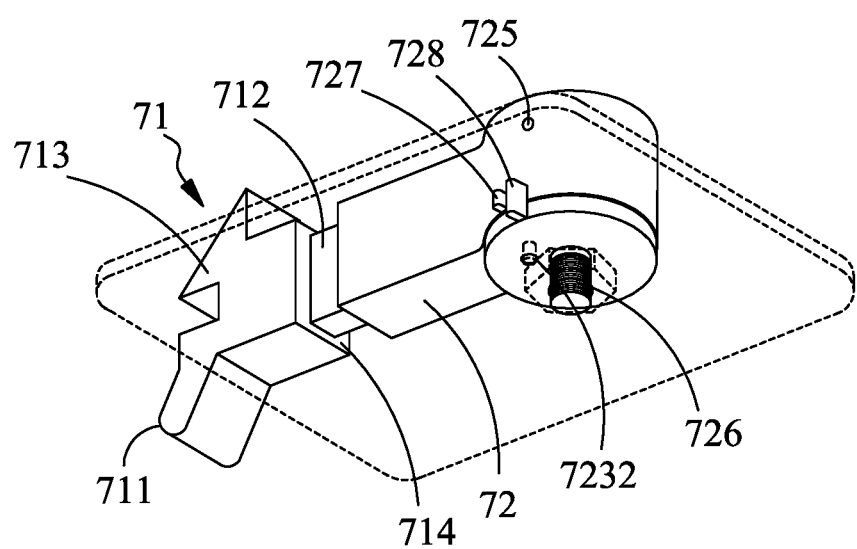
FIG. 16B also shows the quick release connecting device according to the fourth preferred embodiment of the present disclosure.
Figure 16C:
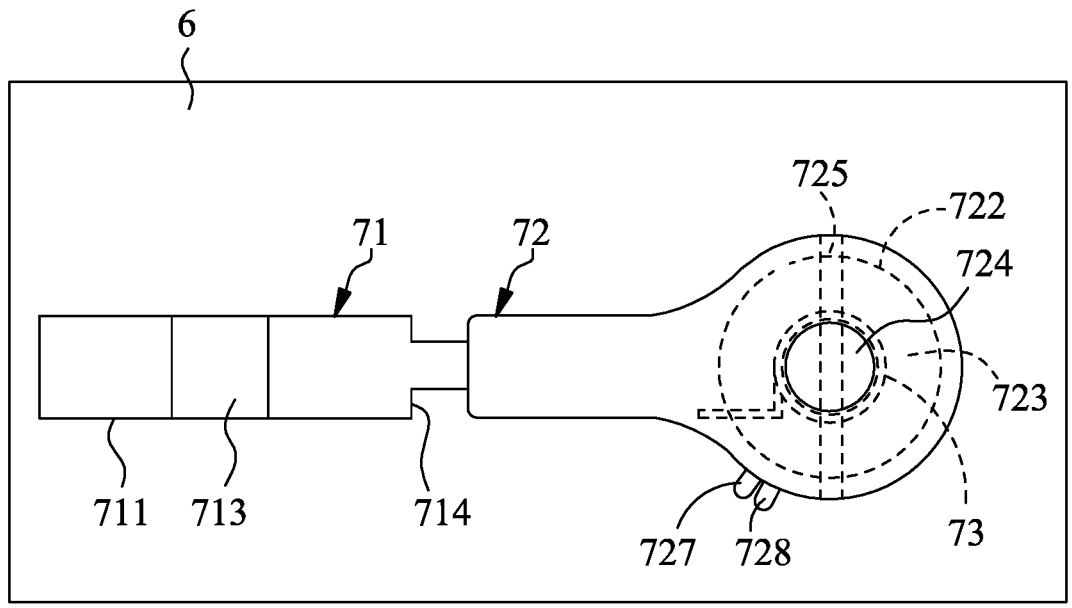
FIG. 16C also shows the quick release connecting device according to the fourth preferred embodiment of the present disclosure.

Please refer to FIGS. 16A to 16C, which show a quick release connecting device 7 according to a fourth preferred embodiment of the present disclosure. In the illustrated fourth preferred embodiment, the pivot portion 722 (please also refer to the pivot portion 722 shown in FIG. 15) has a pivot member 723 movably mounted thereto for coupling with the second object 6. The pivot member 723 includes a shaft 724 movably assembled thereto. The pivot member 723 (or the fixing member 72) and the shaft 724 are assembled together via a second pin connection means 725. An elastic element 73 is fitted on around the pivot portion 722 or the pivot member 723 with an end pressed against (or inserted into) the pivot member 723 (or a structure corresponding to the pivot member 723, such as a hole or a slot, not shown in the drawing) and another end pressed against the fixing member 72 of the quick release connecting device 7. The pivot member 723 includes a coupling section 726 for screwing onto, snap-fitted on, expansion-fitted on, welded to or riveted to the second object 6. Further, the fixing member 72 includes a limiting section 727 and the pivot member 723 includes a corresponding limiting section 728. When the fixing member 72 is moved or rotated, the limiting section 727 and the corresponding limiting section 728 can limit or stop each other at a specific location. The actuating retainer 71 or the body portion 712 thereof includes a shoulder section 714 for limiting a distance by which the actuating retainer 71 or the body portion 712 is allowed to move into the receiving space 721. Alternatively, the shaft 724 can be integrally formed with the pivot member 723 or the pivot portion 722, or can be fixedly assembled to the pivot member 723 or the pivot portion 722 (not shown).

The limiting section 727 or the corresponding limiting section 728 can be a beveled member, a flat member, a stepped member, a recessed member, or a protrusion. When the quick release connecting device 7 is turned by a target angle, the limiting section 727 and the corresponding limiting section 728 stop or limit each other and the quick release connecting device 7 cannot be moved or rotated any further. The target angle can be, for example, ranged from 15 to 345 degrees.

Further, being driven by the elastic element 73, which can be a spring providing a twisting force, the quick release connecting device 7 can automatically turn within an angle limited by between the limiting section 727 and the corresponding limiting section 728 to achieve an elastic restoring motion, or an elastic releasing motion, or an elastic fastening motion.

The quick release connecting device 7 can also be driven by the elastic element 73, which provides a twisting force, to float within a range limited by between the limiting section 727 and the corresponding limiting section 728, including horizontally linear floating, vertically linear floating, or pivotal floating. Herein, a horizontally linear floating amount and a vertically linear floating amount of the quick release connecting device 7 refer to a distance by which the fixing member 72 is horizontally and vertically linearly movable relative to the pivot member 723, respectively; and a pivotal floating amount of the quick release connecting device 7 refers to an angle or a distance by which the fixing member 72 or the actuating retainer 71 is pivotally turnable between two different angularly spaced positions (not shown in FIGS. 16A to 16C).

In addition, the first push section 711 can be in the form of a post, a hole, a recessed member, a protrusion, a retaining member, a stepped member, an anti-slide member, a flat member, a cambered member, or a hooking member.

Figure 17:
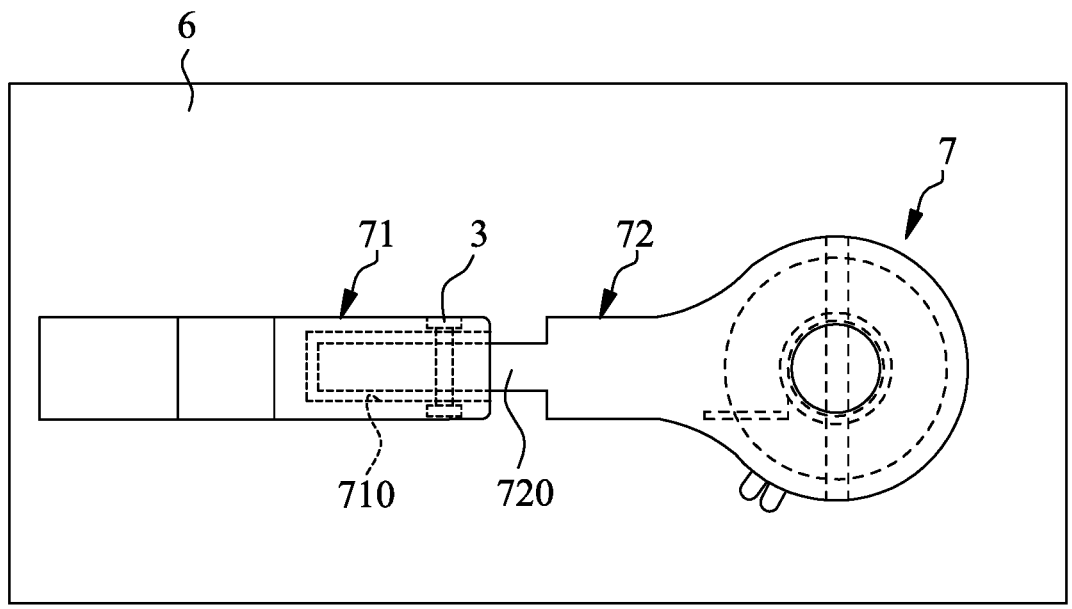
FIG. 17 is an assembled top view of a quick release connecting device according to a fifth preferred embodiment of the present disclosure.

Please refer to FIG. 17, which shows a quick release connecting device 7 according to a fifth preferred embodiment of the present disclosure. In the illustrated fifth preferred embodiment, the actuating retainer 71 of the quick release connecting device 7 internally defines a receiving space 710, and the fixing member 72 includes a body portion 720 movably received in the receiving space 710; and the pin connection means 3 enables connection of the receiving space 710 of the actuating retainer 71 to the body portion 720 of the fixing member 72, such that the actuating retainer 71 and the fixing member 72 are movable relative to each other within a limited range.

Figure 18:
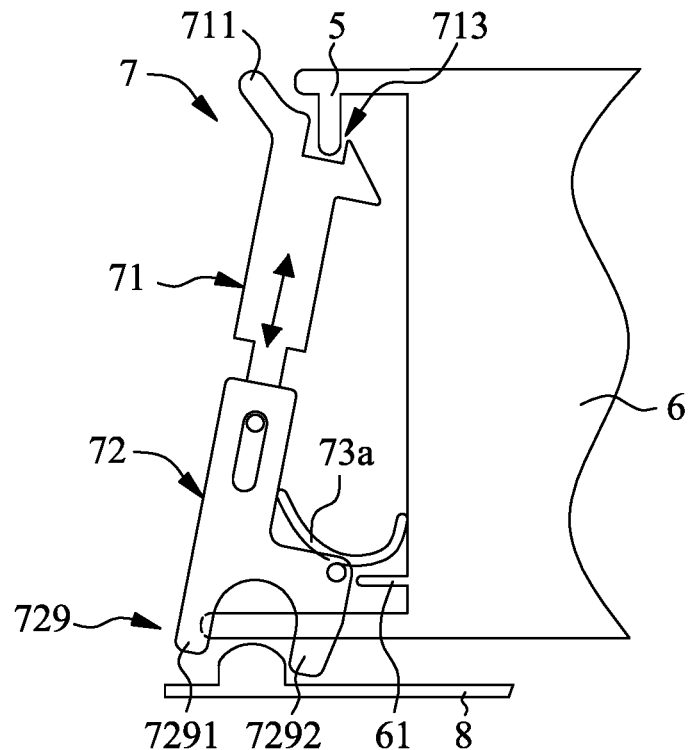
FIG. 18 shows a quick release connecting device according to a sixth preferred embodiment of the present disclosure.
Figure 19:
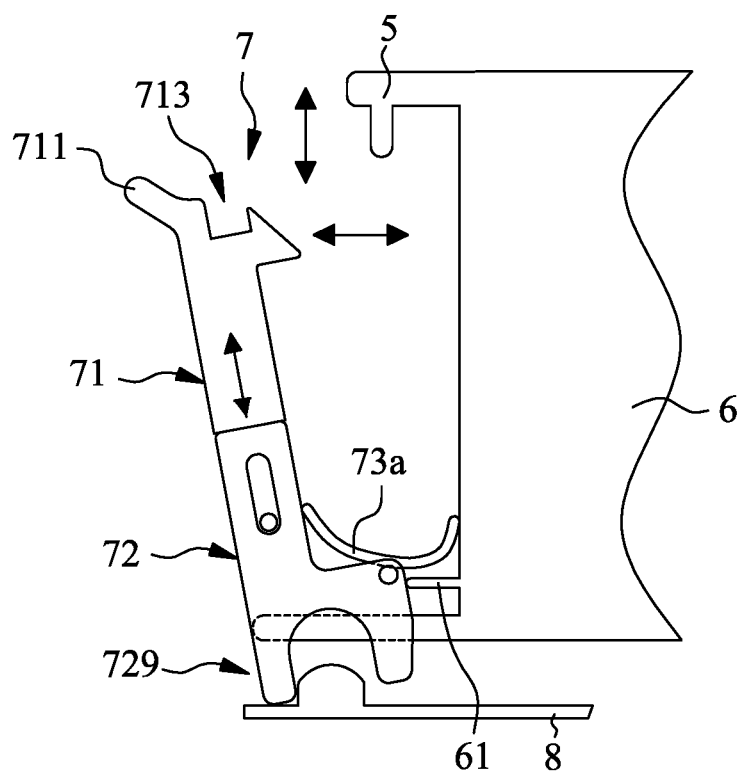
FIG. 19 also shows the quick release connecting device according to the sixth preferred embodiment of the present disclosure.

Please refer to FIGS. 18 and 19, which show a quick release connecting device 7 according to a sixth preferred embodiment of the present disclosure. In the illustrated sixth preferred embodiment, the first object 5 and the second object 6 can be integrally formed, assembled together, or two independent objects; the second object 6 can be assembled to a fourth object 9 to form a modular object; or the quick release connecting device 7 and the second object 6 can be assembled together to form a module with an elastic element 73a pressing an end against the fixing member 72 of the quick release connecting device 7 and another end against the second object 6, such that the fixing member 72 under a spring force of the elastic element 73a is either automatically sprung back to its original position or limited to a fixed position. The fixing member 72 includes a second push section 729 having a first push part 7291 and a second push part 7292. The first push part 7291 or the second push part 7292 can be pressed against a third object 8. The pressing of the second push section 729 against the third object 8 causes a lever displacement, a rotational displacement or a limiting displacement of the quick release connecting device 7, so as to release, fasten, forward move or backward move the quick release connecting device 7. Alternatively, the first push part 7291 or the second push part 7292 can also be displaced by pressing them against the third object 8. The second object 6 includes a limiting section 61 for limiting a distance or an angle by which the second push section 729 can be moved or rotated, respectively. Or, in practical use of the quick release connecting device 7 according to the sixth preferred embodiment, the first push part 7291 and the second push part 7292 can be first subjected to a rotational or a non-rotational displacement to be located at a proper position in front of or behind or at a middle of a position on the third object 8 that is to be pressed against or interfered with, so that the first push part 7291 or the second push part 7292 of the second push section 729 having been rotationally or non-rotationally displaced can press against or interfere with the third object 8, enabling the quick release connecting device 7 to be released, fastened, forward moved or backward moved due to a lever displacement, a rotational displacement or a limiting displacement thereof.

In addition, the second push section 729 can be in the form of a protruded section, a recessed section, a through bore, a stepped section, a flat section, a cambered section or a curved section.

Further, when operating the first push section 711 of the actuating retainer 71 to compress the first push section 711 toward the fixing member 72, an overall travel of the quick release connecting device 7 is shortened, enabling the retaining section 713 to separate from the first object 5 while pulls the second object 6.

Figure 20:
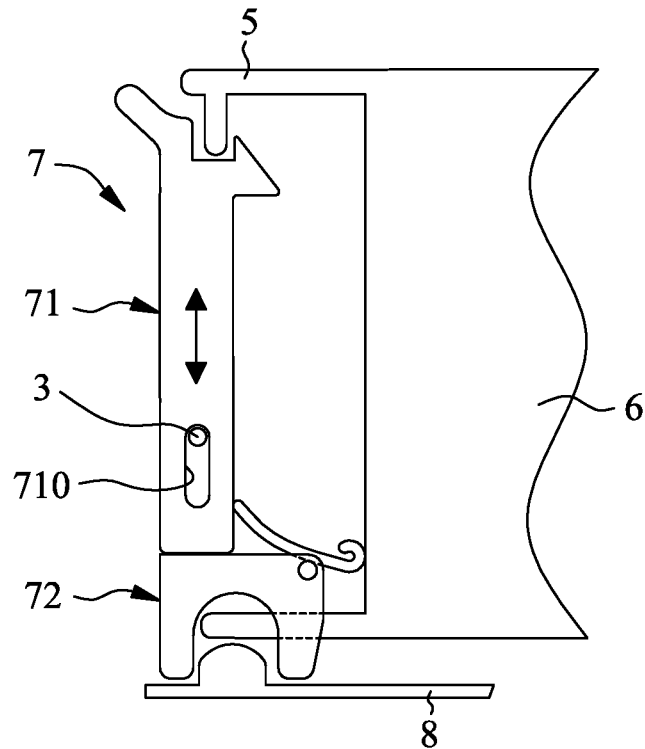
FIG. 20 shows a quick release connecting device according to a seventh preferred embodiment of the present disclosure.
Figure 21:
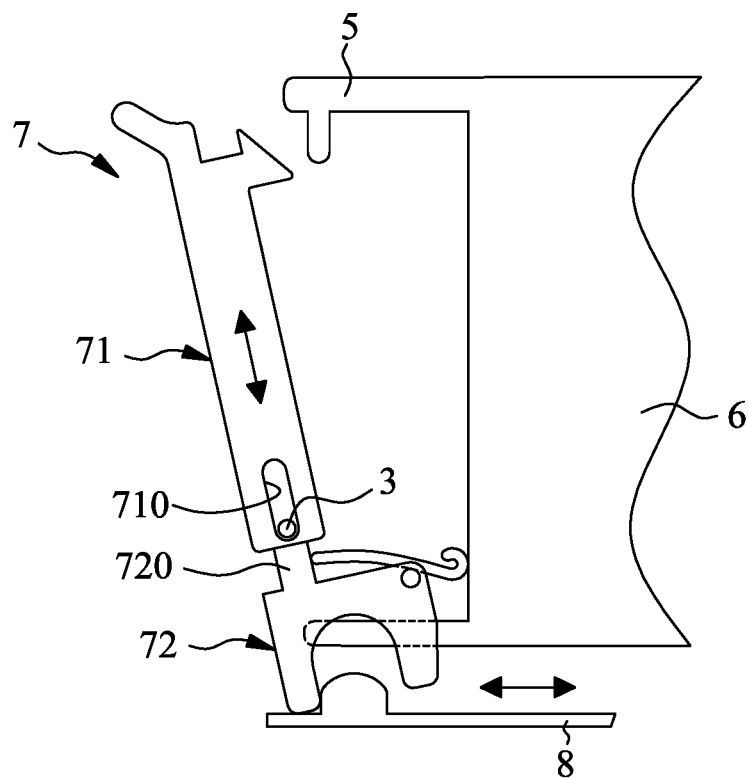
FIG. 21 also shows the quick release connecting device according to the seventh preferred embodiment of the present disclosure.

Please refer to FIGS. 20 and 21, which show a quick release connecting device 7 according to a seventh preferred embodiment of the present disclosure. In the illustrated seventh preferred embodiment, the actuating retainer 71 of the quick release connecting device 7 defines a receiving space 710, and the fixing member 72 includes a body portion 720 movably received in the receiving space 710; and the pin connection means 3 enables connection of the receiving space 710 of the actuating retainer 71 to the body portion 720 of the fixing member 72, such that the actuating retainer 71 and the fixing member 72 are movable relative to each other within a limited range. Further, the elastic element (not shown) is disposed in the receiving space 710 with an end of the elastic element pressed against an inner wall surface of the receiving space 710 and another opposite end against the body portion 720. In this manner, the elastic element enables and controls the limited movement of the actuating retainer 71 and the fixing member 72 relative to each other, and can elastically push the actuating retainer 71 and the fixing member 72 back to their original positions. That is, the seventh preferred embodiment can achieve the same effect as the fifth preferred embodiment.

Figure 22:
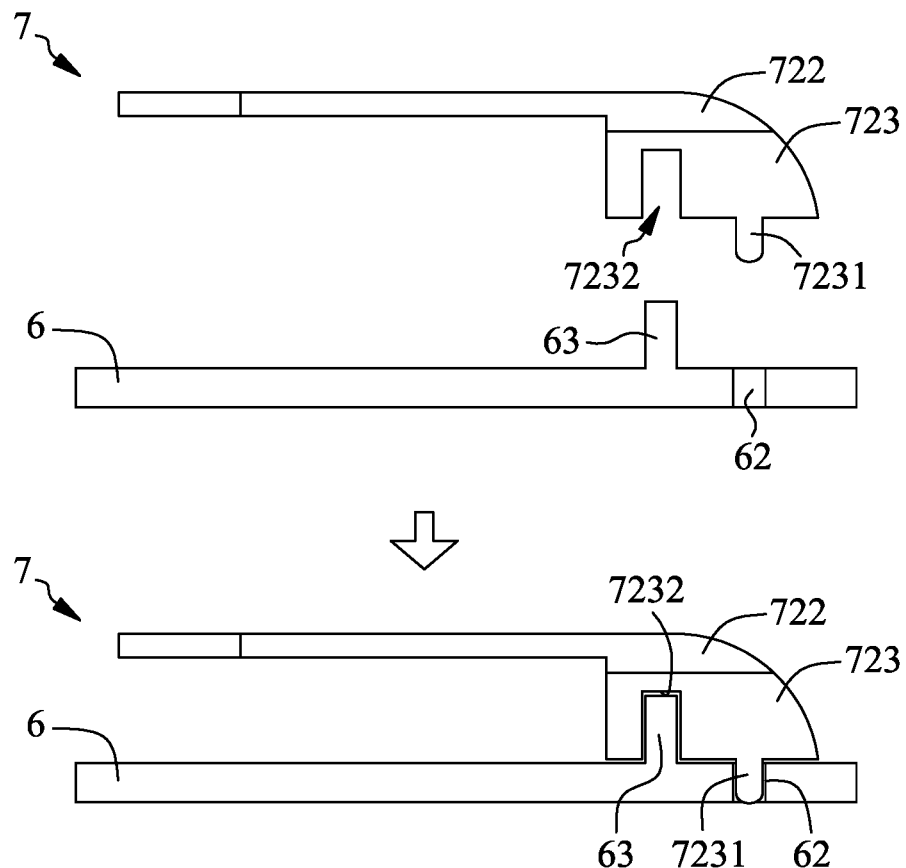
FIG. 22 shows a quick release connecting device according to an eighth preferred embodiment of the present disclosure.
Figure 23:
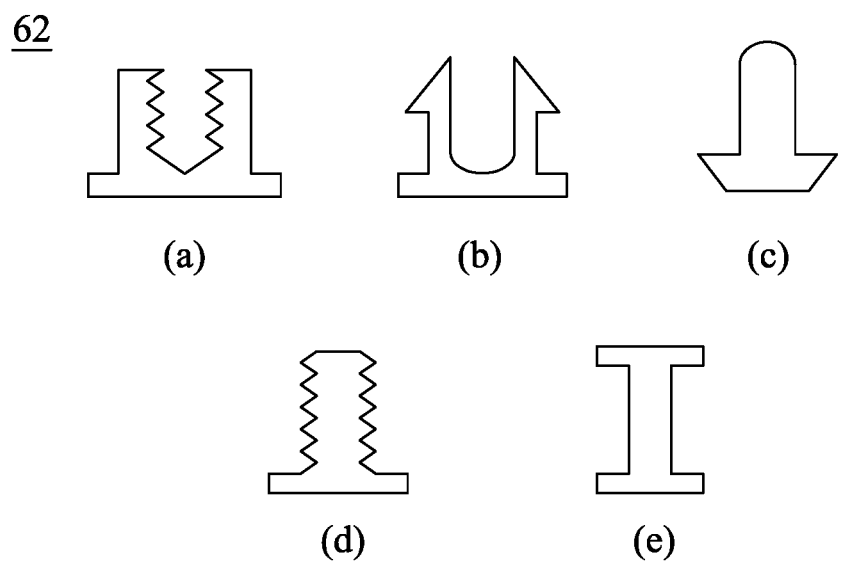
FIG. 23 shows different configurations available for a mounting section provided on a second object, which is to be connected to the quick release connecting device according to the eighth preferred embodiment of the present disclosure.

Please refer to FIG. 22, which shows a quick release connecting device 7 according to an eighth preferred embodiment of the present disclosure, and to FIG. 23, which shows different configurations available for a mounting section 62 provided on a second object 6, which is to be connected to the quick release connecting device 7 according to the eighth preferred embodiment of the present disclosure. In the illustrated eighth preferred embodiment, the second object 6 can be a printed circuit board (PCB), a metal chassis, or a plastic chassis, and is provided with a mounting section 62 and a corresponding directional section 63. According to the eighth preferred embodiment, the mounting section 62 can be differently configured as a post or a hole. In the illustrated eighth preferred embodiment, the pivot member 723 of the quick release connecting device 7 is provided with a coupling section 7231 for coupling with the mounting section of the second object 6 and a directional section 7232 for engaging with the corresponding directional section 63 of the second object 6 to limit the pivot member 723 to specific directions or to restrict the pivot member 723 from rotating or moving.

According to the eighth preferred embodiment, the coupling section 7231 can be in the form of a threaded member, a male fastening element, a female fastening element, a protrusion, a recessed member, a spring plate, a groove, a plate member, a post, a hooking member, a nut, a retaining member, or a hole; the directional section 7232 or the corresponding directional section 63 can be in the form of a hole, a groove, a threaded member, a male fastening element, a female fastening element, a protrusion, a recessed member, a spring plate, a plate member, a nut, a post, a hooking member, or a retaining member; and the mounting section 62 can be in the form of a threaded member, a male fastening element, a female fastening element, a spring plate, a groove, a protrusion, a recessed member, a plate member, a post, a hooking member, a nut, a retaining member, or a hole. In the illustrated eighth preferred embodiment, the mounting section 62 is in the form of a cylindrical hole.

Alternatively, the mounting section 62 can be an independent retaining member or coupling member for engaging with the second object 6 and the quick release connecting device 7. In this case, the independent mounting section 62 can be in the form of a nut as shown in FIG. 23(*a*), an elastic retaining member as shown in FIG. 23(*b*), a post as shown in FIG. 23(*c*), a screw as shown in FIG. 23(*d*), or a male fastening element as shown in FIG. 23(*e*).

Figure 24:
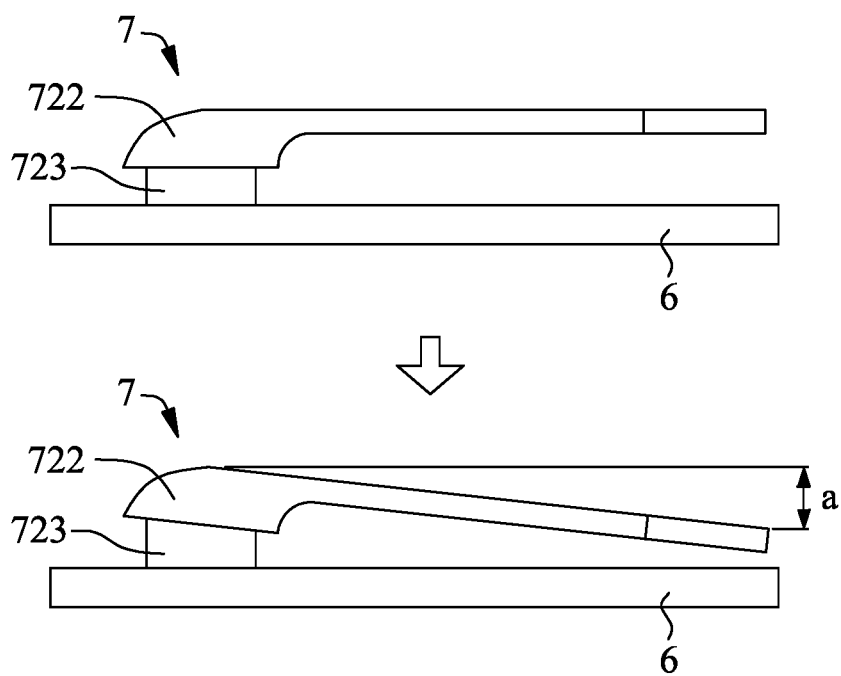
FIG. 24 shows a quick release connecting device according to a ninth preferred embodiment of the present disclosure that allows for a vertically pivotal floating amount.
Figure 25:
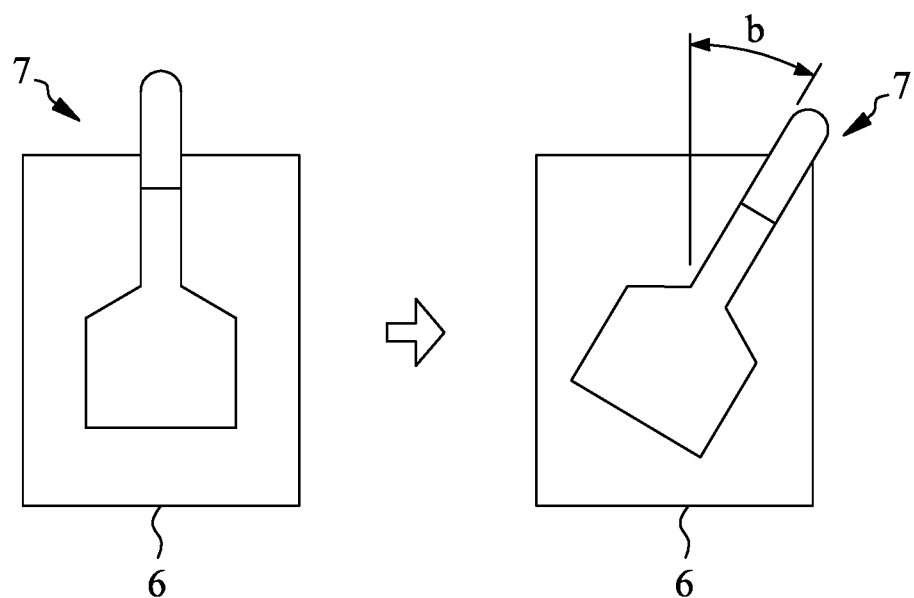
FIG. 25 shows the floating fixing member of the quick release connecting device according to the ninth preferred embodiment of the present disclosure that allows for a horizontally pivotal floating amount.
Figure 26:
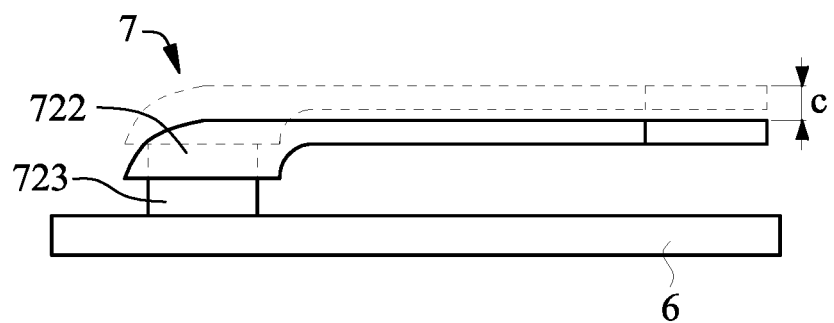
FIG. 26 shows the floating fixing member of the quick release connecting device according to the ninth preferred embodiment of the present disclosure that allows for a vertically linear floating amount.
Figure 27:
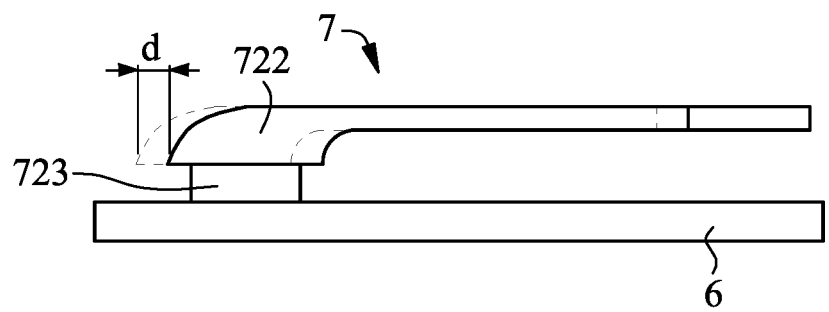
FIG. 27 shows the floating fixing member of the quick release connecting device according to the ninth preferred embodiment of the present disclosure that allows for a horizontally linear floating amount.

Please refer to FIGS. 24 to 27, in which a quick release connecting device 7 having a floating fixing member 72 according to a ninth preferred embodiment of the present disclosure is shown. According to the ninth preferred embodiment, the pivot member 723 of the quick release connecting device 7 is connected to the second object 6, such that a floating amount is allowable between the quick release connecting device 7 and the second object 6, between the pivot portion 722 and the pivot member 723, between the fixing member 72 and the second object 6, between the fixing member 72 and the pivot member 723, or between different angular positions of the fixing member 72. The floating amount can be a vertically pivotal floating amount "a" as shown in FIG. 24; a horizontally pivotal floating amount "b" as shown in FIG. 25; a vertically linear floating amount "c" as shown in FIG. 26; or a horizontally linear floating amount "d" as shown in FIG. 27. With the allowable floating amount "a", "b", "c" or "d", the quick release connecting device 7 can be pivotally moved relative to the second object 6 in a vertical direction, be pivotally moved relative to the second object 6 in a horizontal direction, be linearly moved upward and downward relative to the second object 6 in a vertical direction, or be linearly moved forward and backward relative to the second object 6 in a horizontal direction, respectively. Preferably, the floating amount "a", "b", "c" or "d" is a distance ranged from 0.01 mm to 500 mm, and the floating amount "a" or "b" can be alternately an angle ranged from 0.1 to 345 degrees.

Figure 28:
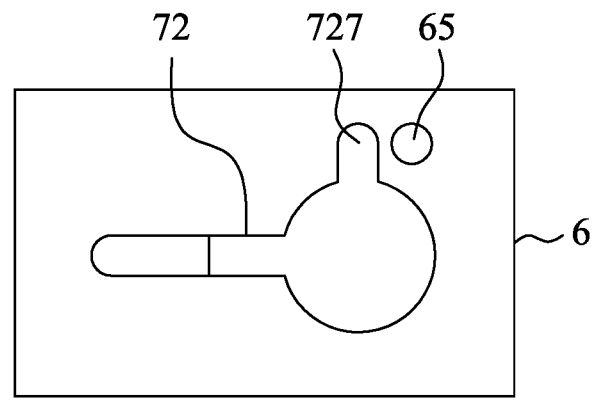
FIG. 28 shows a quick release connecting device according to a tenth preferred embodiment of the present disclosure.

Please refer to FIG. 28, which shows a quick release connecting device 7 according to a tenth preferred embodiment of the present disclosure. In the tenth preferred embodiment, the fixing member 72 of the quick release connecting device 7 includes a limiting section 727, and the second object 6 is provided with a corresponding limiting section 65. When the fixing member 72 is moved or turned, the limiting section 727 and the corresponding limiting section 65 can limit or stop each other at a specific location.

Figure 29:
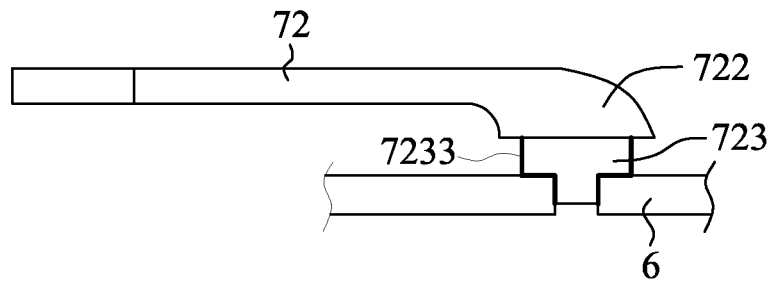
FIG. 29 shows a quick release connecting device according to an eleventh preferred embodiment of the present disclosure.

Please refer to FIG. 29, which shows a quick release connecting device 7 according to an eleventh preferred embodiment of the present disclosure. In the eleventh preferred embodiment, the pivot member 723 is movably mounted to the pivot portion 722 of the fixing member 72, and the pivot member 723 has a weldable surface 7233, which can be heated and welded to the second object 6. The weldable surface 7233 can be formed of tin, nickel, copper, chrome, iron or zinc; and the second object 6 can be a printed circuit board (PCB). Further, in this case, the second object 6 also has a weldable surface (not shown).

Figure 30:
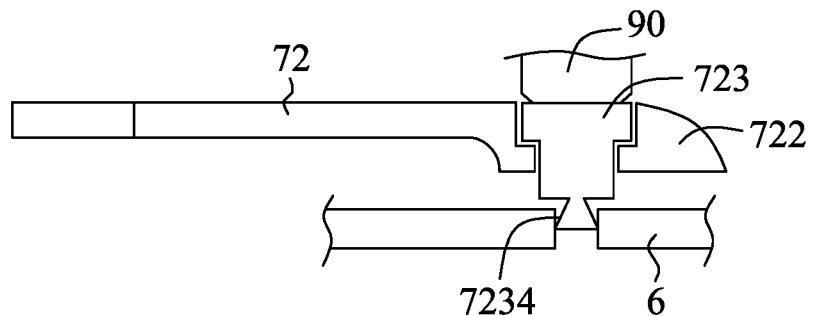
FIG. 30 shows a quick release connecting device according to a twelfth preferred embodiment of the present disclosure.
Figure 30:
Figure 30:
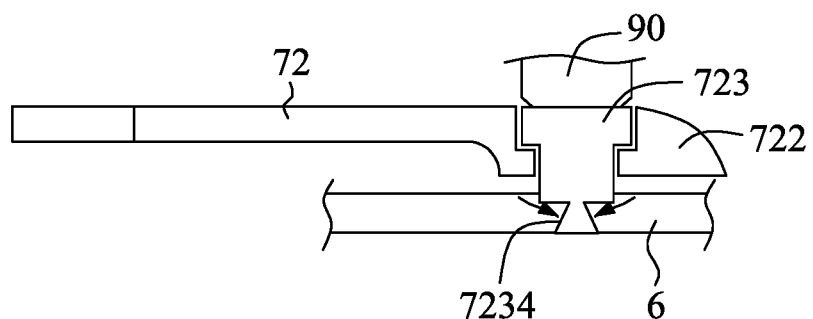

Please refer to FIG. 30, which shows a quick release connecting device according to a twelfth preferred embodiment of the present disclosure. In the twelfth preferred embodiment, the pivot member 723 is movably mounted to the pivot portion 722 of the fixing member 72, and the pivot member 723 has a material retaining space formed thereon. When the pivot member 723 is press-fitted onto the second object 6 under an external force applied thereto, some material of the second object 6 is forced or flows into the material retaining space 7234. In this case, the pivot member 723 has a material hardness higher than that of the second object 6, and the external force can be applied to the pivot member 723 by a mold 90.

Figure 31:
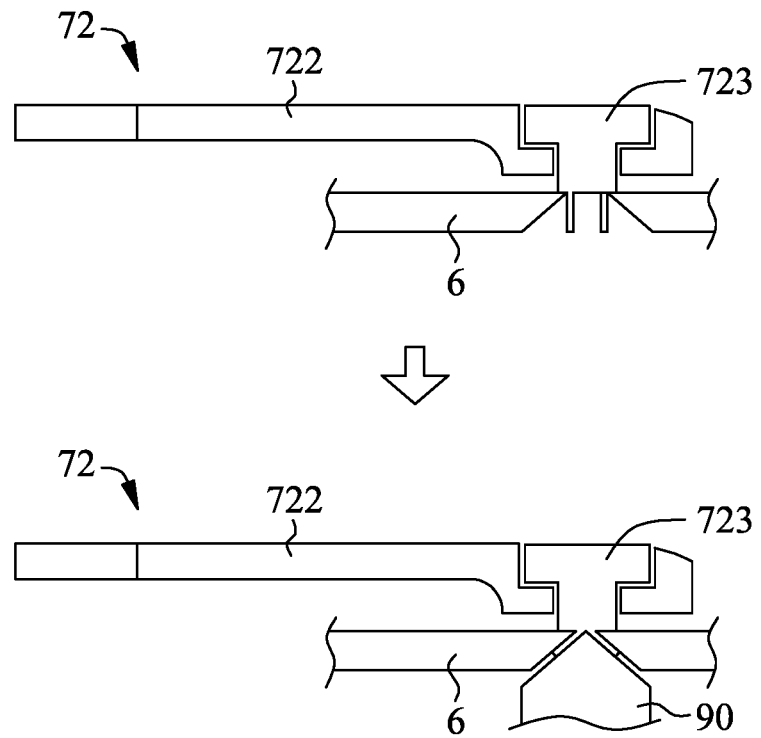
FIG. 31 shows a quick release connecting device according to a thirteenth preferred embodiment of the present disclosure.

Please refer to FIG. 31, which shows a quick release connecting device according to a thirteenth preferred embodiment of the present disclosure. In the thirteenth preferred embodiment, the pivot member 723 is movably mounted to the pivot portion 722 of the fixing member 72, and the pivot member 723 has a portion that is deformable under an external force applied thereto by a mold 90, so that the deformed portion of the pivot member 723 is abutted on or interfered with the second object 6.

Figure 32:
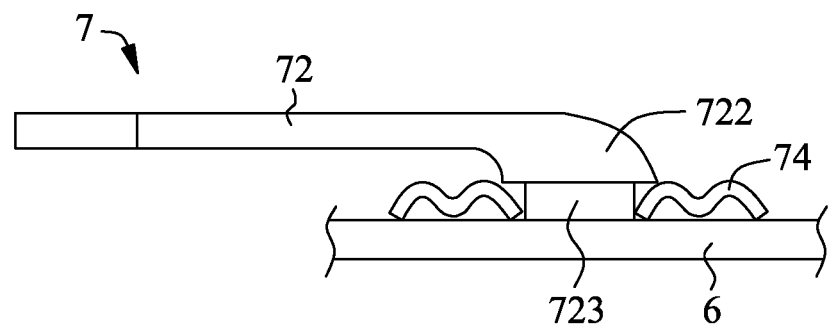
FIG. 32 shows a quick release connecting device according to a fourteenth preferred embodiment of the present disclosure.
Figure 33:
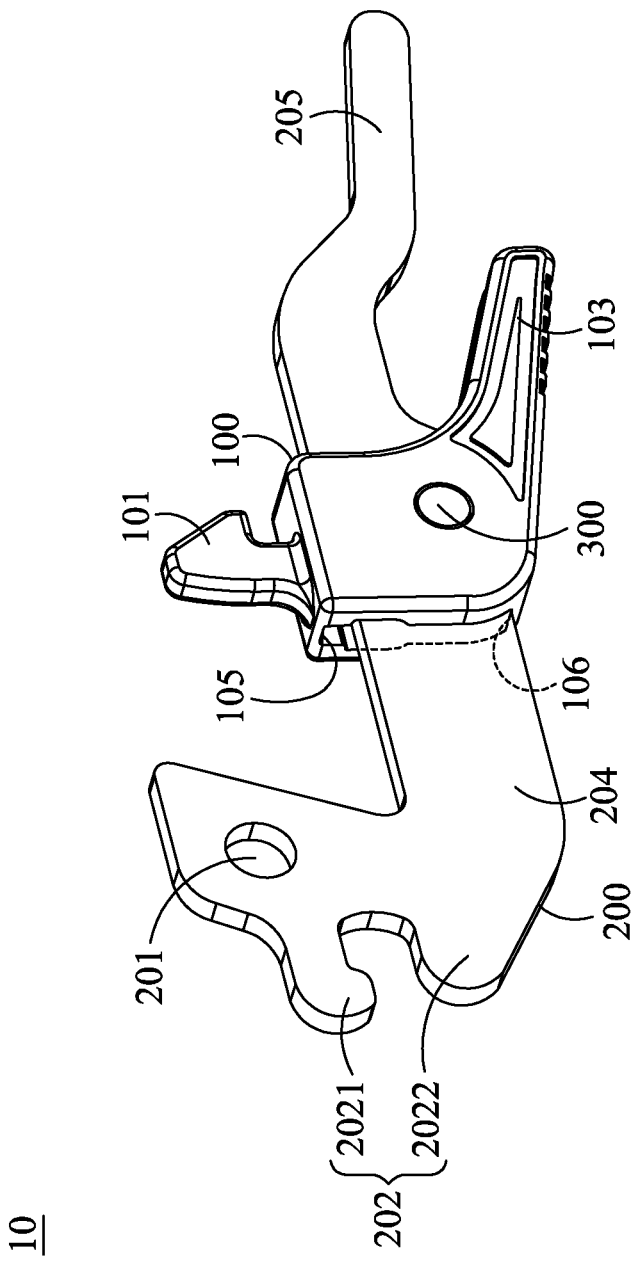
FIG. 33 is a perspective view of a quick release connecting device according to a fifteenth preferred embodiment of the present disclosure.
Figure 34:
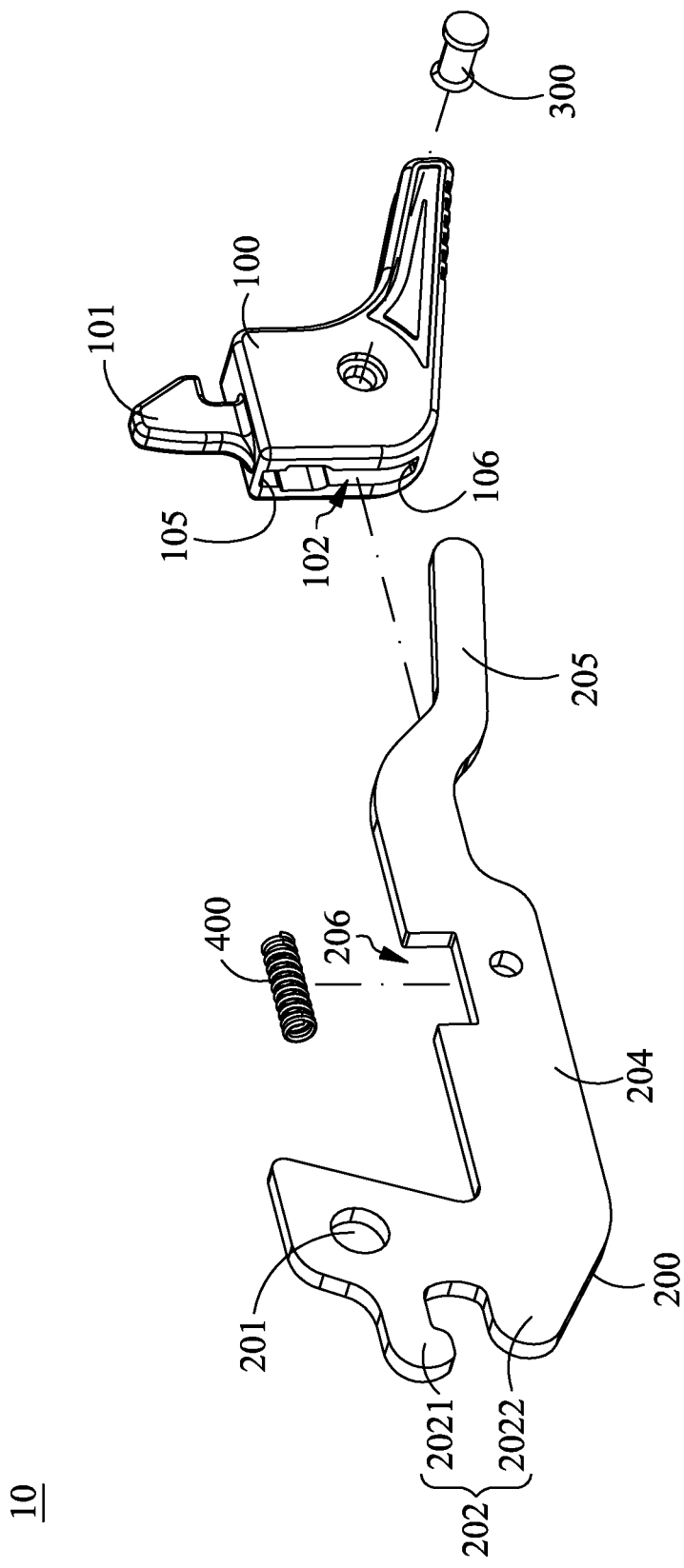
FIG. 34 is an exploded view of FIG. 33.
Figure 35:
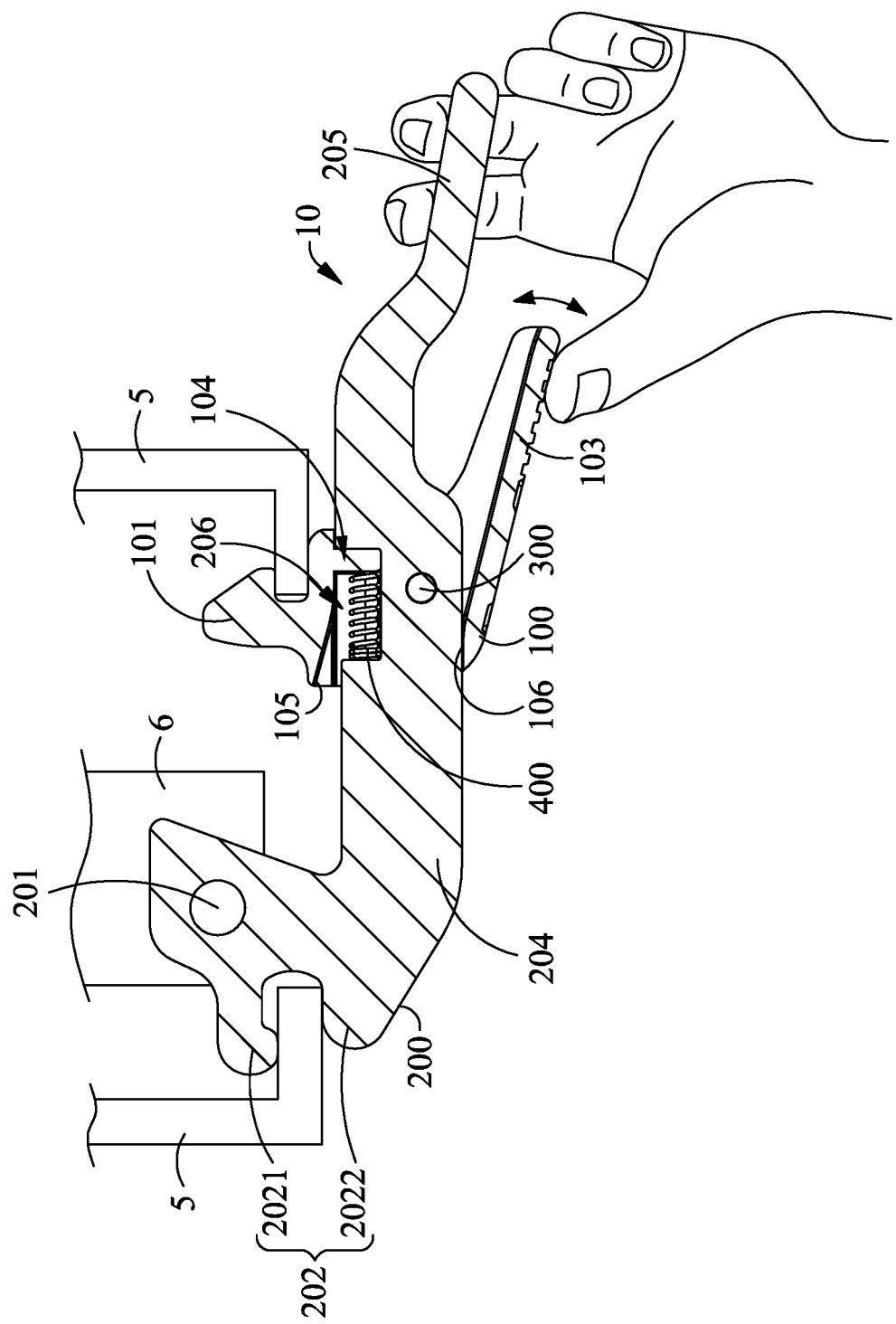
FIG. 35 shows the use of the quick release connecting device in the fifteenth preferred embodiment of the present disclosure.
Figure 36:
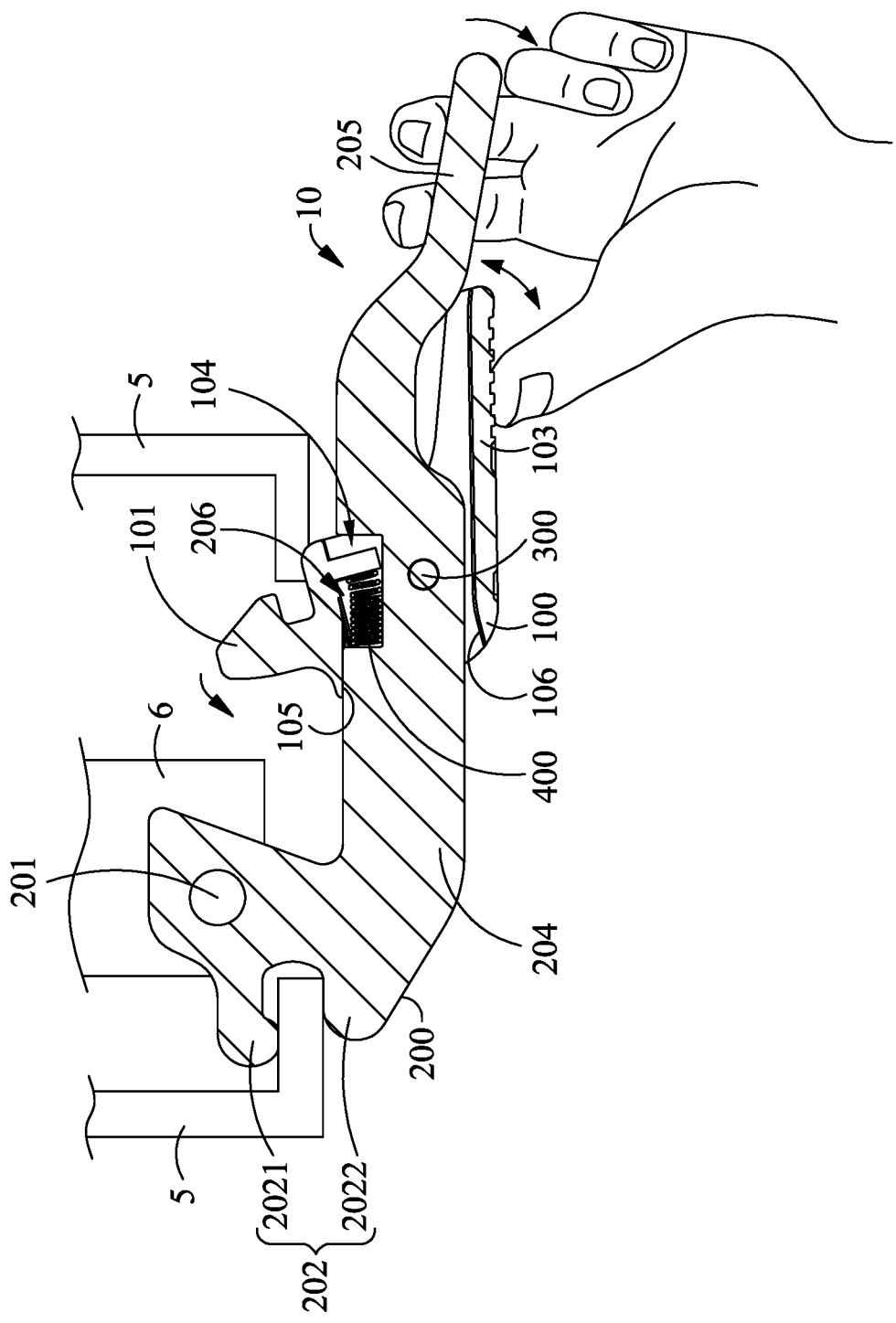
FIG. 36 also shows the use of the quick release connecting device in the fifteenth preferred embodiment of the present disclosure.

Please refer to FIG. 32, which shows a quick release connecting device according to a fourteenth preferred embodiment of the present disclosure. In the fourteenth preferred embodiment, the pivot member 723 is movably mounted to the pivot portion 722 of the fixing member 72, and an elastic member 74, a friction-increasing member or a friction-decreasing member is disposed between the fixing member 72 and the pivot portion 722, between the fixing member 72 and the pivot member 723, between the pivot portion 722 and the second object 6, between the pivot portion 722 and the pivot member 723, between pivot member 723 and the second object 6, or between the fixing member 72 and the second object 6. The elastic member 74, the friction-increasing member or the friction-decreasing member can be in the form of a flat spring, a coil spring, an elastic bar, a torsion spring, a pillar, a plate member, a smooth flat member, or a smooth-surface member. The elastic member 74 provides a torsional force or a frictional force against the quick release connecting device 7 when the same is being moved, so as to limit the moving speed or the moving force of the quick release connecting device 7, or to limit or increase the vertically pivotal floating amount, the horizontally pivotal floating amount, the vertically linear floating amount, or the horizontally linear floating amount of the quick release connecting device 7.

Please refer to FIGS. 33 to 36, which show a quick release connecting device 10 according to a fifteenth preferred embodiment of the present disclosure. In the fifteenth preferred embodiment, the quick release connecting device 10 includes an actuating retainer 100 and a fixing member 200 movably assembled to the actuating retainer 100 via pin connection means 300. The actuating retainer 100 includes a retaining section 101 for detachably engaging with a first object 5. The fixing member 200 includes a pivot portion 201 and a clamp portion 202. The pivot portion 201 has a pivot member 203 movably mounted thereto for connecting to a second object 6. The clamp portion 202 is used to engage with the first object 5 or a third object. The quick release connecting device 10 utilizes principle of leverage to release the first object 5 (or the third object) and the second object 6 from each other. The first object 5 is a printed circuit board, a metal board or a plastic board. The second object 6 is a printed circuit board, a metal board or a plastic board. The third object is a printed circuit board, a metal board or a plastic board.

To use the quick release connecting device 10, first connect the pivot portion 201 of the fixing member 200 to the second object 6 via the pivot member 203. Then, engage the retaining section 101 of the actuating retainer 100 with the first object 5 and engage the clamp portion 202 of the fixing member 200 with the first object 5 or a third object to complete the connection of the first object 5 to the second object 6.

To separate the first object 5 and the second object 6 from one another, simply apply a force against the actuating retainer 100 to disengage the retaining section 101 from the first object 5. Then, turn the fixing member 200 about the pivot member 203 to disengage the clamp portion 202 of the fixing member 200 from the first object 5. At this point, the first object 5 is separated from the second object 6.

In the fifteenth preferred embodiment, the actuating retainer 100 has a receiving space 102 and the fixing member 200 is received in the receiving space. The pin connection means 300 is transversely extended through the receiving space 102 and the fixing member 200, so that the fixing member 200 is movably assembled to the actuating retainer 100. In this way, a force can be applied against the actuating retainer 100 to move the retaining section 101 relative to the fixing member 200, so as to engage or disengage the retaining section 101 with or from the first object 5.

In the fifteenth preferred embodiment, the actuating retainer 100 includes a force application section 103 located opposite to the fixing member 200; and the fixing member 200 includes a body portion 204 and a handle portion 205. The body portion 204 is extended through the receiving space 102 of the actuating retainer 100. The handle portion 205 is located corresponding to the force application section 103. With these arrangements, the force application section 103 and the handle portion 205 can be simultaneously pressed to move away from or to move toward each other to engage or disengage the retaining section 101 with or from the first object 5, respectively. Alternatively, a force can be applied to the handle portion 205 to pivotally turn the fixing member 200, so that the clamp portion 202 of the fixing member 200 is separated from or engaged with the first object 5.

In practical use of the quick release connecting device 10 according to the fifteenth preferred embodiment, the user may press the thumb against the force application section 103 and press the index finger against the handle portion 205, and exert force on the force application section 103 and the handle portion 205 with the thumb, the index finger and the middle finger at the same time. Due to a human ergonomic design of the force application section 103 and the handle portion 205, the force application section 103 can be easily operated via the thumb pressed against it for the retaining section 101 to engage with the first object 5 or to disengage from the first object 5. Therefore, the quick release connecting device 10 is easily operable for use.

In the fifteenth preferred embodiment, the quick release connecting device 10 further includes an elastic element 400, which has an end limited in place by the actuating retainer 100 and another end pressed against the fixing member 200. When the force application section 103 and the handle portion 205 are simultaneously pressed by the user, the elastic element 400 is compressed at the same time. When the retaining section 101 is engaged with or disengaged from the first object 5 or when the clamp portion 202 is engaged with or disengaged from the first object 5, the user may release the force application section 103 or the handle portion 205. At this point, the elastic element 400 automatically releases its elasticity for the force application section 103 to return to its original position and can be operated again later.

In the fifteenth preferred embodiment, the actuating retainer 100 includes an abutting section 104 that can be a limiting recess, and the fixing member 200 includes a holding portion 206 that is located corresponding to the abutting section 104. The elastic element 400 is disposed in the abutting section 104 with one end thereof limited in place by the abutting section 104 of the actuating retainer 100 and the other end thereof pressed against the holding portion 206 of the fixing member 200. In this manner, the elastic element 400 is stably held in between the holding portion 206 and the abutting section 104 to maintain stable function thereof.

In the preferred fifteenth embodiment, the clamp portion 202 includes a first protruded jaw 2021 and a second protruded jaw 2022. The first object 5 engaged with the clamp portion 202 is located in between the first and second protruded jaws 2021, 2022. With this design, the first and the second protruded jaw 2021, 2022 enable the clamp portion 202 to firmly and stably engage with the first object 5 or the third object. When applying a force to pivotally turn the fixing member 200, the first protruded jaw 2021 or the second protruded jaw 2022 of the fixing member 200 is brought to push against the first object 5 to thereby disengage the fixing member 200 from the first object 5.

In the preferred fifteenth embodiment, the actuating retainer 100 includes a first limiting section 105 and a second limiting section 106. The first limiting section 105 is correspondingly located at a top inner side of the receiving space 102 of the actuating retainer 100, and the second limiting section 106 is correspondingly located at a bottom inner side of the receiving space 102 of the actuating retainer 100. With this design, when the actuating retainer 100 is moved under a force applied thereto, the retaining section 101 thereof will be moved to engage with or disengage from the first object 5, which respectively brings the first limiting section 105 or the second limiting section 106 to abut on the body portion 204 of the fixing member 200 and prevents the actuating retainer 100 from being excessively turned.

In the fifteenth preferred embodiment, the handle portion 205 of the fixing member 200 can be a bar extended beyond an end of the actuating retainer 100 located opposite to the pivot portion 201.

In the fifteenth preferred embodiment, the handle portion 205 of the fixing member 200 can be a bar located between the actuating retainer 100 and the pivot portion 201.

While the present disclosure has been described by means of specific embodiments, numerous modifications and variations could be made thereto by those skilled in the art without departing from the scope and spirit of the present disclosure set forth in the claims.

What is claimed is:

1. A quick release connecting device, comprising an actuating retainer and a fixing member movably assembled to the actuating retainer via pin connection means; the actuating retainer including a retaining section and a force application section, and the fixing member including a handle portion located corresponding to the force application section for operating the force application section, such that the retaining section is engaged with an object;

and the fixing, member further including a pivot portion;

wherein the actuating retainer includes a receiving space; the fixing member being received in the receiving space, and the pin connection means being transversely extended through the receiving space of the actuating retainer and through the fixing member for the fixing member to be movably assembled to the actuating retainer.

2. The quick release connecting device according to claim 1, wherein the fixing member includes a body portion, which is extended through the receiving space of the actuating retainer.

3. The quick release connecting device according to claim 1, further comprising an elastic element, which has an end limited in place by the actuating retainer and another end pressed against the fixing member.

4. The quick release connecting device according to claim 3, wherein the actuating retainer includes an abutting section and the fixing member includes a holding portion that is located corresponding to the abutting section; and the elastic element being disposed in the abutting section with one end limited in place by the abutting section of the actuating retainer and the other end pressed against the holding portion of the fixing member.

5. The quick release connecting device according to claim 1, wherein the actuating retainer includes a first limiting section and a second limiting section; the first limiting section being located at a top inner side of the actuating retainer and the second limiting section being located at a bottom inner side of the actuating retainer, such that the first limiting section or the second limiting section will finally abut on the fixing member to limit the actuating retainer from moving further when the actuating retainer is moved relative to the fixing member.

6. The quick release connecting device according to claim 1, wherein the handle portion of the fixing member is a bar extended beyond an end of the actuating retainer located opposite to the pivot portion.

7. The quick release connecting device according to claim 1, wherein the handle portion of the fixing member is a bar located between the actuating retainer and the pivot portion.

8. The quick release connecting device according to claim 1, wherein the handle portion of the fixing member is a closed grip formed by a bar located between the actuating retainer and the pivot portion.

* * * * *